(12) United States Patent
Tang

(10) Patent No.: US 12,150,292 B2
(45) Date of Patent: Nov. 19, 2024

(54) INTEGRATED ASSEMBLIES HAVING VOIDS ALONG REGIONS OF GATES, AND METHODS OF FORMING CONDUCTIVE STRUCTURES

(71) Applicant: Micron Technology, Inc., Boise, ID (US)

(72) Inventor: Sanh D. Tang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 17/891,480

(22) Filed: Aug. 19, 2022

(65) Prior Publication Data

US 2022/0406785 A1    Dec. 22, 2022

Related U.S. Application Data

(60) Continuation of application No. 17/318,940, filed on May 12, 2021, now Pat. No. 11,456,299, which is a division of application No. 16/727,153, filed on Dec. 26, 2019, now Pat. No. 11,088,142.

(51) Int. Cl.
*H10B 12/00*    (2023.01)
(52) U.S. Cl.
CPC ......... *H10B 12/315* (2023.02); *H10B 12/033* (2023.02); *H10B 12/05* (2023.02); *H10B 12/482* (2023.02); *H10B 12/488* (2023.02)
(58) Field of Classification Search
None
See application file for complete search history.

(56) References Cited

U.S. PATENT DOCUMENTS

| | | |
|---|---|---|
| 6,661,702 B1 | 12/2003 | Walker |
| 7,745,319 B2 | 6/2010 | Tang et al. |
| 7,749,840 B2 | 7/2010 | Yun et al. |
| 7,846,796 B2 | 12/2010 | Yun et al. |
| 8,076,721 B2 | 12/2011 | Tang et al. |
| 8,748,289 B2 | 6/2014 | Nakanishi et al. |
| 9,281,402 B2 | 3/2016 | Tang et al. |
| 9,754,946 B1 * | 9/2017 | Yang ............... H01L 21/76897 |
| 9,773,888 B2 | 9/2017 | Pulugurtha et al. |
| 9,837,420 B1 * | 12/2017 | Ramaswamy .... H01L 27/10814 |

(Continued)

FOREIGN PATENT DOCUMENTS

| | | |
|---|---|---|
| KR | 10-0739532 | 7/2007 |
| WO | WO 2019/050805 | 3/2019 |
| WO | PCT/US2020/063826 | 6/2022 |

*Primary Examiner* — Steven M Christopher
(74) *Attorney, Agent, or Firm* — Wells St. John P.S.

(57) ABSTRACT

Some embodiments include an integrated assembly with a semiconductor-material-structure having a first source/drain region, a second source/drain region, and a channel region between the first and second source/drain regions. The semiconductor-material-structure has a first side and an opposing second side. A first conductive structure is adjacent to the first side and is operatively proximate the channel region to gatedly control coupling of the first and second source/drain regions through the channel region. A second conductive structure is adjacent to the second side and is spaced from the second side by an intervening region which includes a void. Some embodiments include methods of forming integrated assemblies.

18 Claims, 43 Drawing Sheets

(56) References Cited

U.S. PATENT DOCUMENTS

| | | |
|---|---|---|
| 9,911,805 B2 | 3/2018 | Chuang et al. |
| 10,804,273 B2 | 10/2020 | Ramaswamy |
| 2012/0104491 A1* | 5/2012 | Heineck ............ H01L 27/10888 257/334 |
| 2018/0174971 A1* | 6/2018 | Song ................. H01L 27/10888 |

* cited by examiner

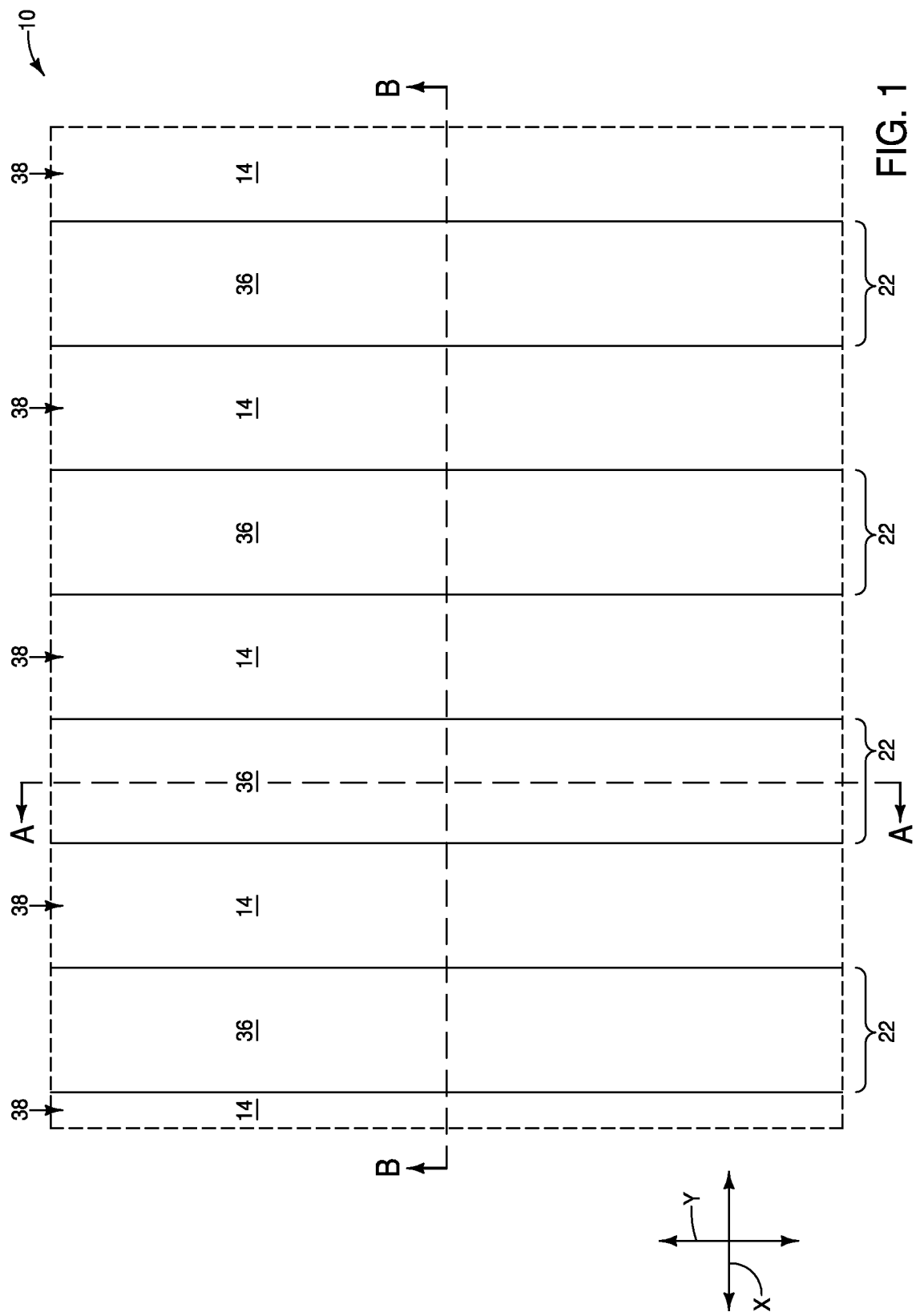

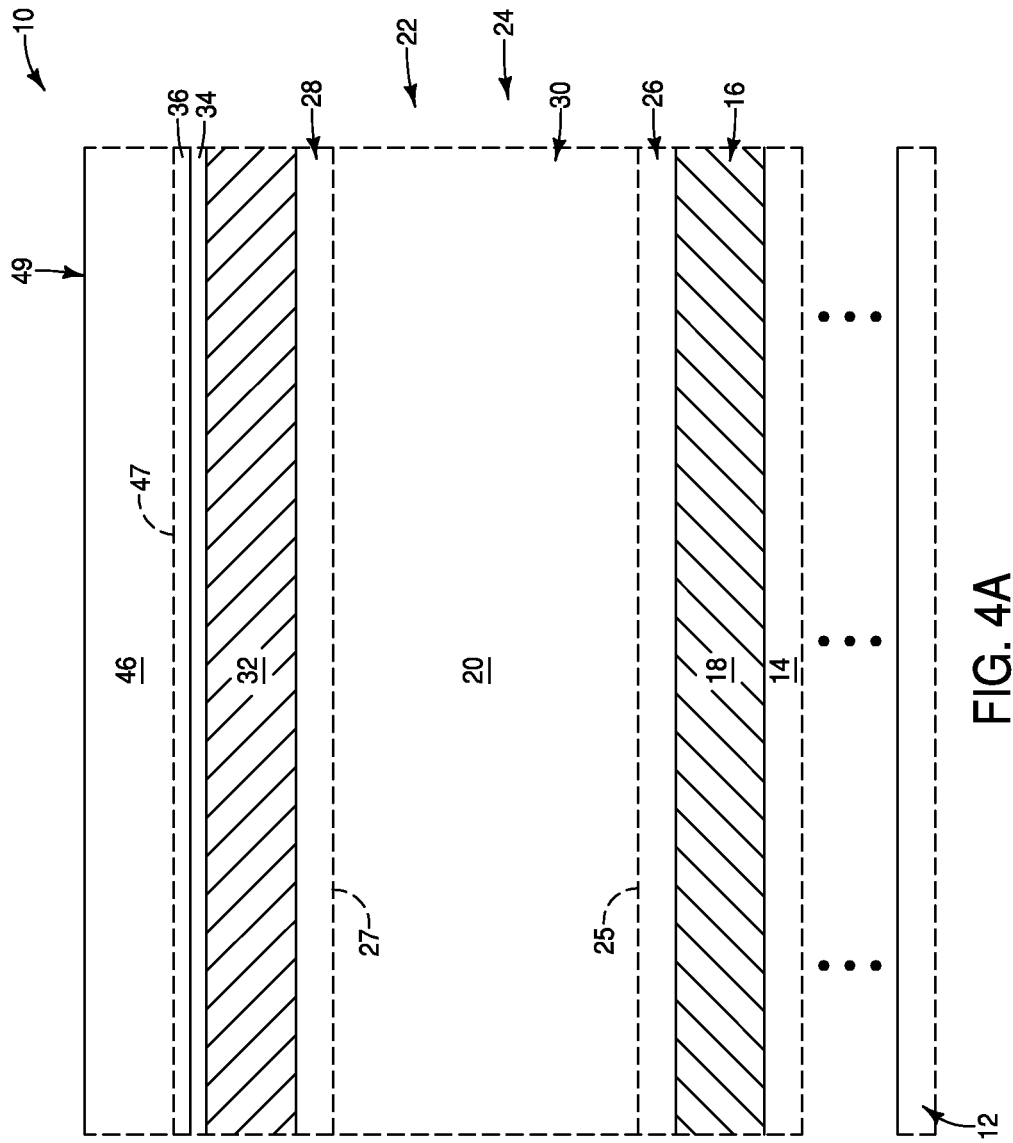
FIG. 4A
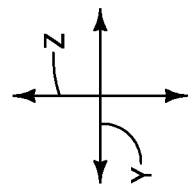

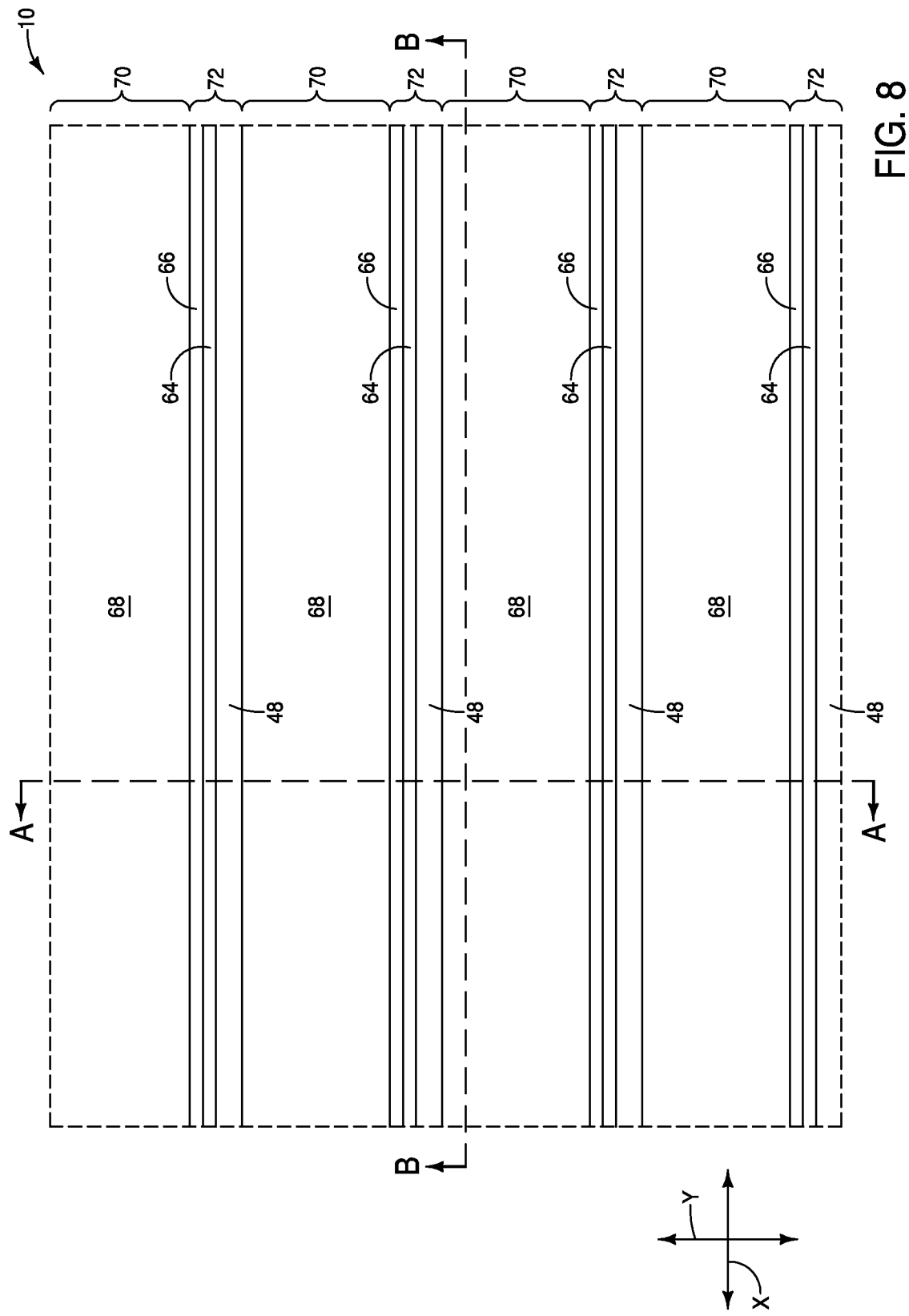

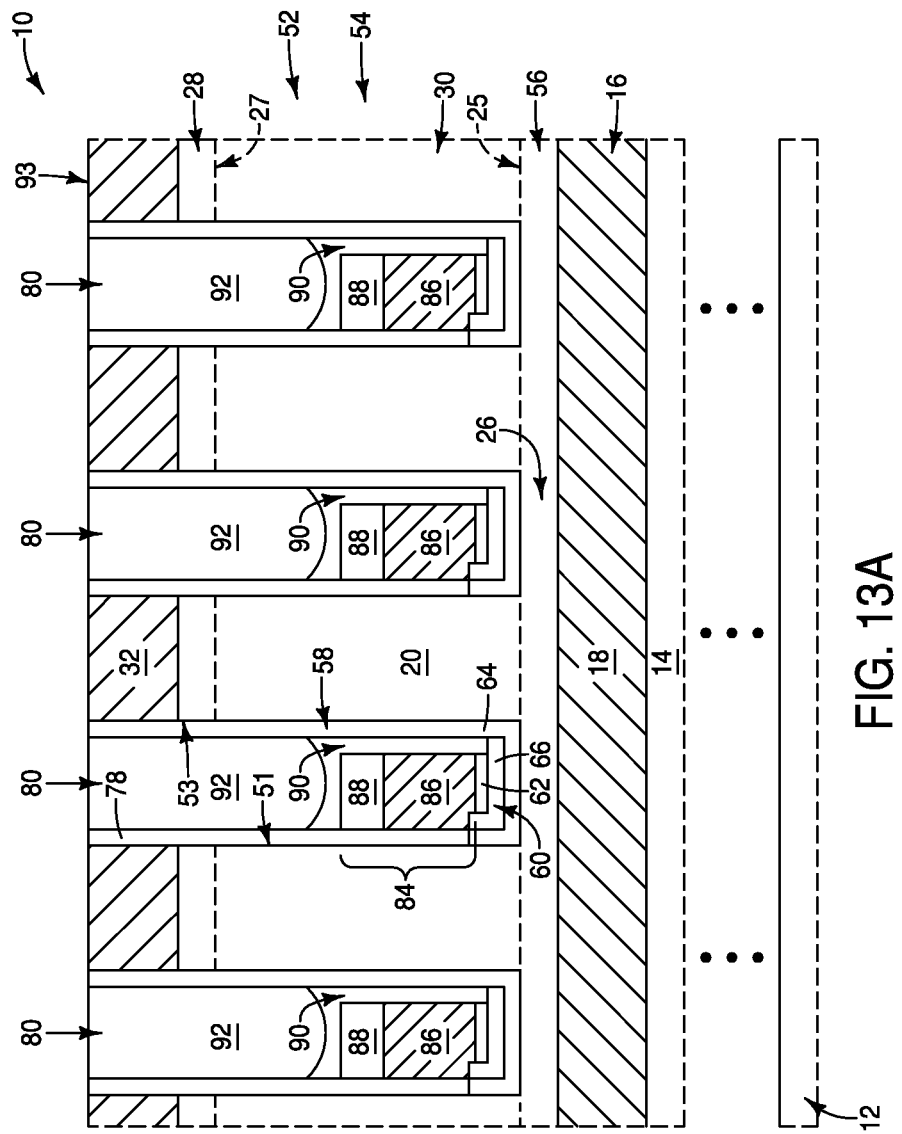
FIG. 13A
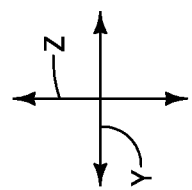

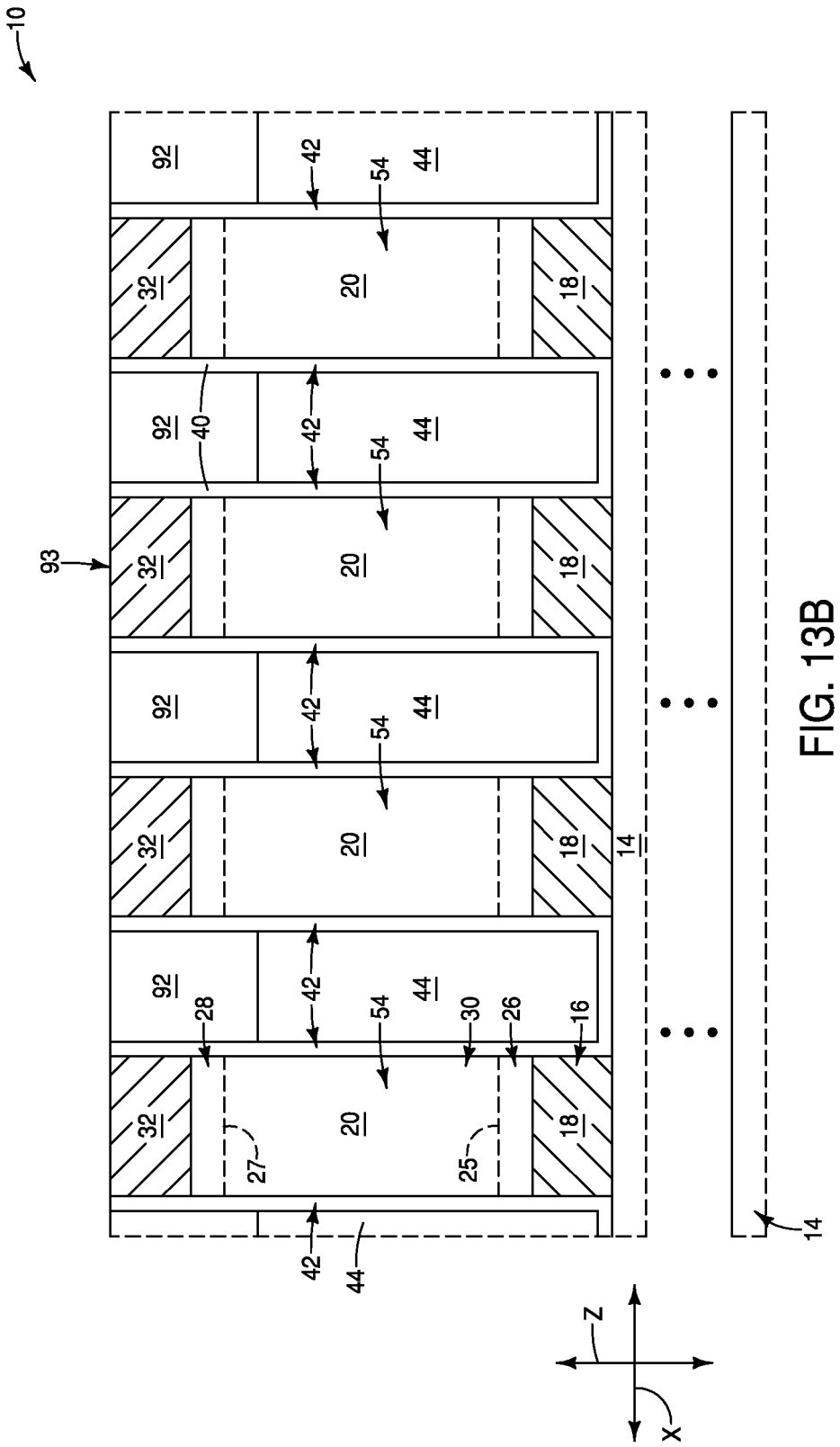

INTEGRATED ASSEMBLIES HAVING VOIDS ALONG REGIONS OF GATES, AND METHODS OF FORMING CONDUCTIVE STRUCTURES

RELATED PATENT DATA

This patent resulted from a continuation of U.S. patent application Ser. No. 17/318,940 filed May 12, 2021, which is a divisional of U.S. patent application Ser. No. 16/727,153 filed Dec. 26, 2019, each of which is hereby incorporated by reference herein.

TECHNICAL FIELD

Integrated assemblies (e.g., integrated memory). Integrated assemblies having voids along regions of gates. Methods of forming integrated assemblies.

BACKGROUND

Memory is one type of integrated circuitry, and is used in computer systems for storing data. An example memory is DRAM (dynamic random-access memory). DRAM cells (memory cells) may each comprise a transistor in combination with a capacitor. The DRAM cells may be arranged in an array; with wordlines (gate lines) extending along rows of the array, and with digit lines (bitlines) extending along columns of the array. The wordlines may be coupled with the transistors of the memory cells. Each memory cell may be uniquely addressed through a combination of one of the wordlines with one of the digit lines.

A problem which may be encountered in conventional memory architectures is crosstalk (disturbance) between memory cells, leading to loss of data. The crosstalk becomes increasingly problematic as memory architectures are scaled to increasing levels of integration. It would be desirable to alleviate or prevent such undesired crosstalk.

BRIEF DESCRIPTION OF THE DRAWINGS

FIGS. 1-1B are diagrammatic views of a region of an example construction at an example process stage of an example method for forming an example integrated assembly. FIG. 1 is a top view. FIGS. 1A and 1B are cross-sectional side views along the lines A-A and B-B, respectively, of FIG. 1.

FIG. 2 is a top view. FIGS. 2A and 2B are cross-sectional side views along the lines A-A and B-B, respectively, of FIG. 2.

FIG. 3 is a top view. FIGS. 3A and 3B are cross-sectional side views along the lines A-A and B-B, respectively, of FIG. 3.

FIG. 4 is a top view. FIGS. 4A and 4B are cross-sectional side views along the lines A-A and B-B, respectively, of FIG. 4.

FIG. 5 is a top view. FIGS. 5A and 5B are cross-sectional side views along the lines A-A and B-B, respectively, of FIG. 5.

FIG. 6 is a top view. FIGS. 6A and 6B are cross-sectional side views along the lines A-A and B-B, respectively, of FIG. 6.

FIG. 7 is a top view. FIGS. 7A and 7B are cross-sectional side views along the lines A-A and B-B, respectively, of FIG. 7.

FIGS. 8-8B are diagrammatic views of the region of FIGS. 1-1B at an example process stage following that of FIGS. 7-7B. FIG. 8 is a top view. FIGS. 8A and 8B are cross-sectional side views along the lines A-A and B-B, respectively, of FIG. 8.

FIG. 9 is a top view. FIGS. 9A and 9B are cross-sectional side views along the lines A-A and B-B, respectively, of FIG. 9.

FIG. 10 is a top view. FIGS. 10A and 10B are cross-sectional side views along the lines A-A and B-B, respectively, of FIG. 10.

FIG. 11 is a top view. FIGS. 11A and 11B are cross-sectional side views along the lines A-A and B-B, respectively, of FIG. 11. The construction of FIGS. 11-11B may be considered to be a region of an example integrated assembly, or a region of an example memory device.

FIG. 12 is a top view. FIGS. 12A and 12B are cross-sectional side views along the lines A-A and B-B, respectively, of FIG. 12.

FIGS. 13-13B are diagrammatic views of the region of FIGS. 1-1B at an example process stage following that of FIGS. 12-12B. FIG. 13 is a top view. FIGS. 13A and 13B are cross-sectional side views along the lines A-A and B-B, respectively, of FIG. 13. The construction of FIGS. 13-13B may be considered to be a region of an example integrated assembly, or a region of an example memory device.

FIG. 14 is a top view. FIGS. 14A and 14B are cross-sectional side views along the lines A-A and B-B, respectively, of FIG. 14.

DETAILED DESCRIPTION OF THE ILLUSTRATED EMBODIMENTS

Some embodiments include integrated assemblies (e.g., integrated memory) having a conductive structure (e.g., a gate) between a pair of transistor channel regions. One of the channel regions is operatively proximate the conductive structure such that operation of the conductive structure controls current flow within the channel region. The other of the channel regions is spaced from the conductive structure by an intervening region which includes a void. Some embodiments include methods of forming integrated assemblies. Example embodiments are described with reference to FIGS. 1-15.

Figure 1A:
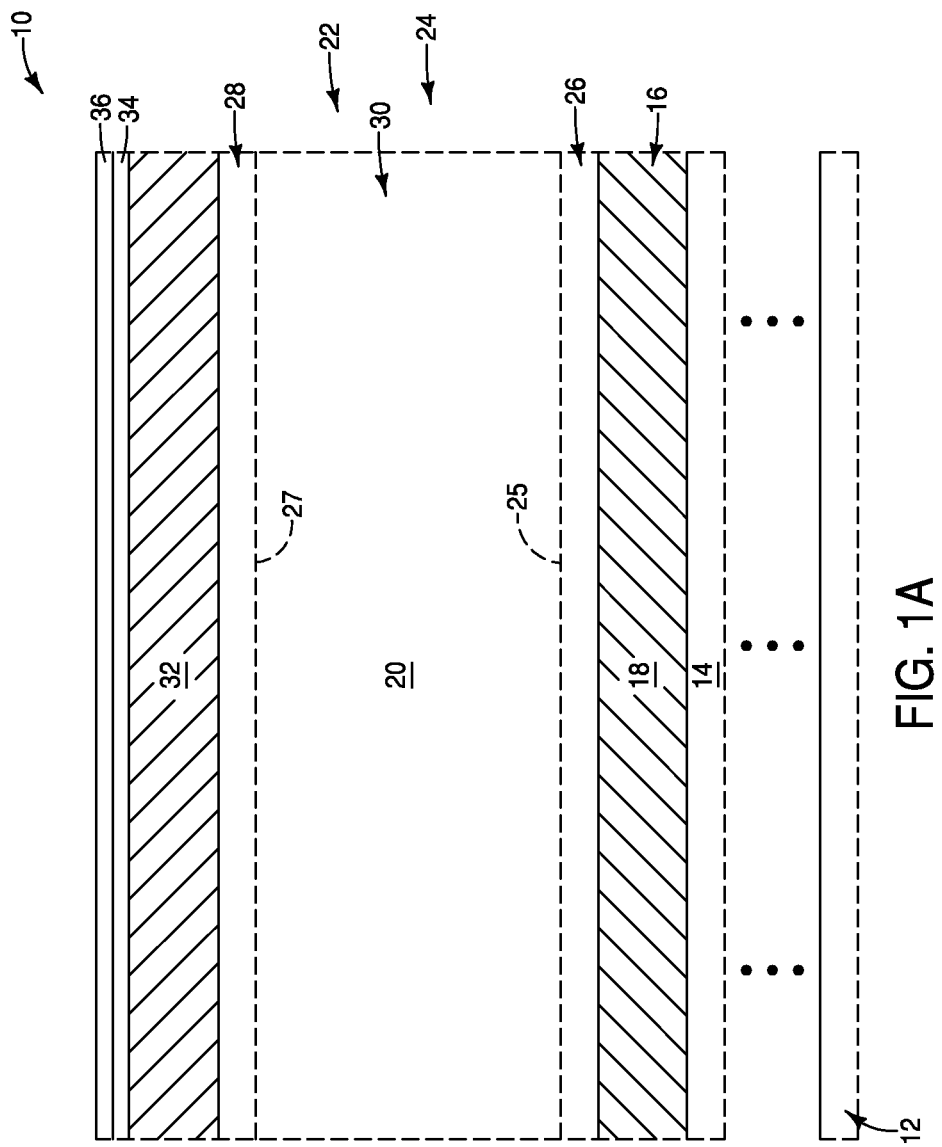
Figure 1B:
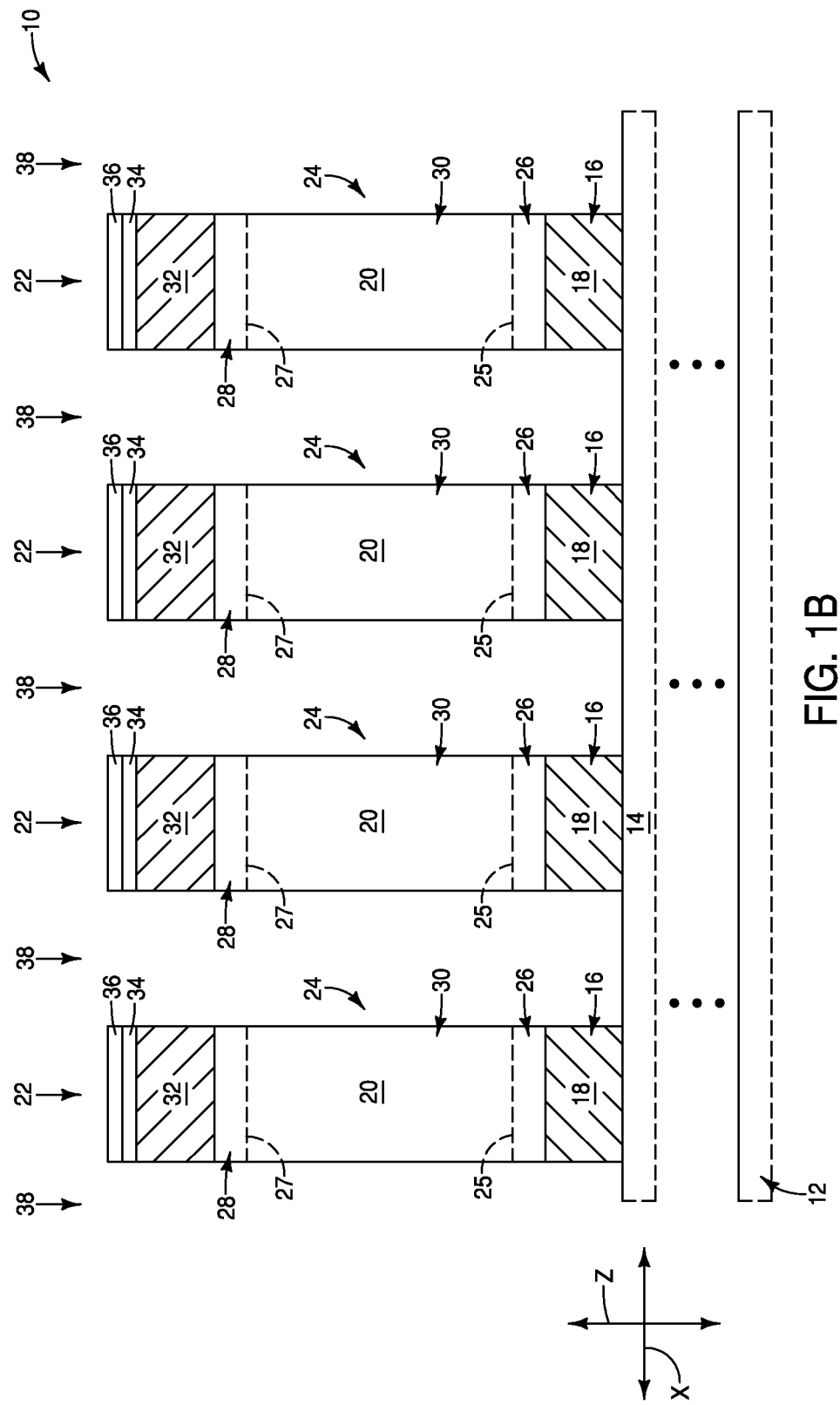

Referring to FIGS. 1-1B, an integrated assembly (structure, architecture, etc.) 10 includes a base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 12 may correspond to a semiconductor substrate containing one or more materials associated with integrated circuit fabrication. Such materials may include, for example, one or more of refractory metal materials, barrier materials, diffusion materials, insulator materials, etc.

An insulative material 14 is supported over the base 12. The insulative material 14 may comprise any suitable electrically insulative composition(s); and in some embodiments may comprise, consist essentially of, or consist of silicon dioxide. A gap is provided between the insulative material 14 and the base 12 to indicate that there may be other materials, structures, etc., provided between the base 12 and the insulative material 14. However, in some embodiments the insulative material 14 may be directly against an upper surface of the base 12.

Digit lines 16 are over the insulative material 14. The digit lines 16 comprise conductive digit-line-material 18. The digit-line-material 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit-line-material 18 may comprise, consist essentially of, or consist of one or more metal-containing materials; such as, for example, one or more of tungsten, titanium, tungsten nitride, titanium nitride, tungsten silicide, titanium silicide, etc.

Semiconductor material 20 is over the digit lines 16. The semiconductor material 20 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 20 may comprise, consist essentially of, or consist of silicon. The silicon may be in any suitable crystalline form (e.g., one or more of monocrystalline, polycrystalline and amorphous).

The semiconductor material 20 and the digit lines 16 are together patterned as rails 22, with such rails extending along a first direction indicated to be a y-axis direction. The rails 22 may be considered to be supported by the insulative material 14, which in turn may be considered to be supported by the base 12.

The semiconductor material 20 of the rails 22 is configured as semiconductor-material-beams (linear configurations) 24 which are over the digit lines.

The semiconductor material 20 of each of the semiconductor-material-linear-configurations 24 is shown to comprise a lower heavily-doped region 26, an upper heavily-doped region 28, and an intermediate region 30 between the upper and lower regions 26 and 28. Dashed lines 25 and 27 are provided to diagrammatically illustrate approximate boundaries between the heavily-doped regions and the intermediate region. The heavily-doped regions 26 and 28 ultimately become lower and upper source/drain regions, respectively, of vertical transistors (access devices), and may be referred to as source/drain regions. The intermediate regions 30 ultimately become channel regions of the transistors, and accordingly may referred to as channel regions. Although the semiconductor material 20 is shown to be doped at the process stage of FIGS. 1-1B, it is to be understood that in other embodiments at least some of the doping of the semiconductor material 20 may occur at later process stages.

Metal-containing material 32 is formed over the semiconductor material 20. The material 32 may comprise any suitable composition(s), and in some embodiments may comprise one or more of the metal-containing materials described above relative to the conductive material 18. The materials 18 and 32 may comprise a same composition as one another, or may comprise different compositions relative to one another. In some embodiments, the material 18 of the digit lines 16 may be referred to as a first electrode material, and the material 32 may be referred to as a second electrode material. The first electrode material 18 is electrically coupled with the bottom source/drain regions 26, and the second electrode material 32 is electrically coupled with the upper source/drain regions 28.

Insulative materials 34 and 36 are over the conductive material 32. Such insulative materials may comprise any suitable compositions. In some embodiments, the first insulative material 34 may comprise, consist essentially of, or consist of silicon dioxide or carbon-doped silicon dioxide; and the second insulative material 36 may comprise, consist essentially of, or consist of silicon nitride.

The materials 32, 34 and 36 may be considered to be part of the rails (linear features) 22. In some embodiments, the materials 18, 20 32, 34 and 36 may be patterned from an expanse to form the rails 22.

The rails 22 are spaced from one another by gaps 38, with such gaps extending to an upper surface of the insulative material 14 in the shown embodiment.

Figure 2:
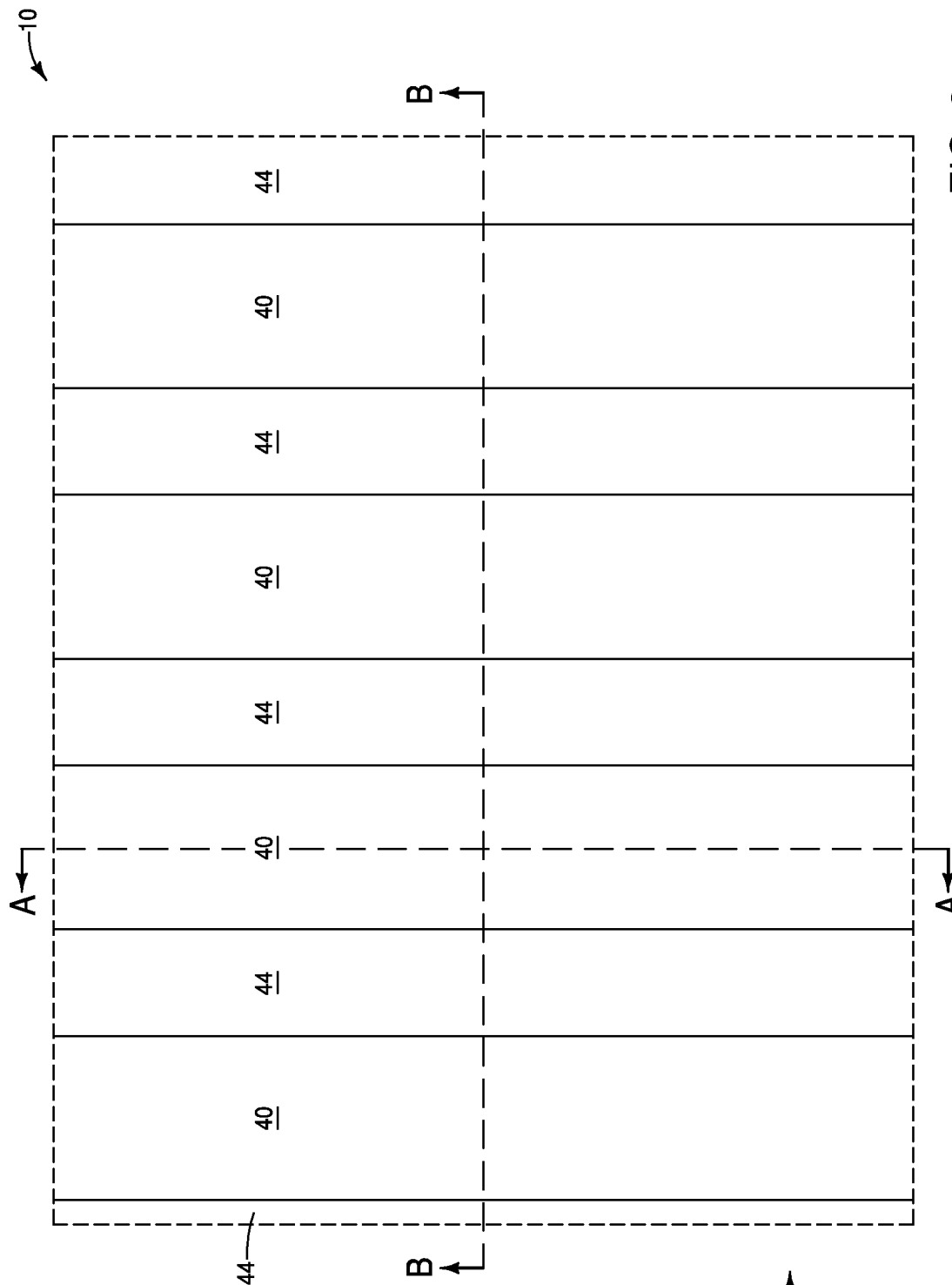
FIGS. 2-2B are diagrammatic views of the region of FIGS. 1-1B at an example process stage following that of FIGS. 1-1B.
Figure 2A:
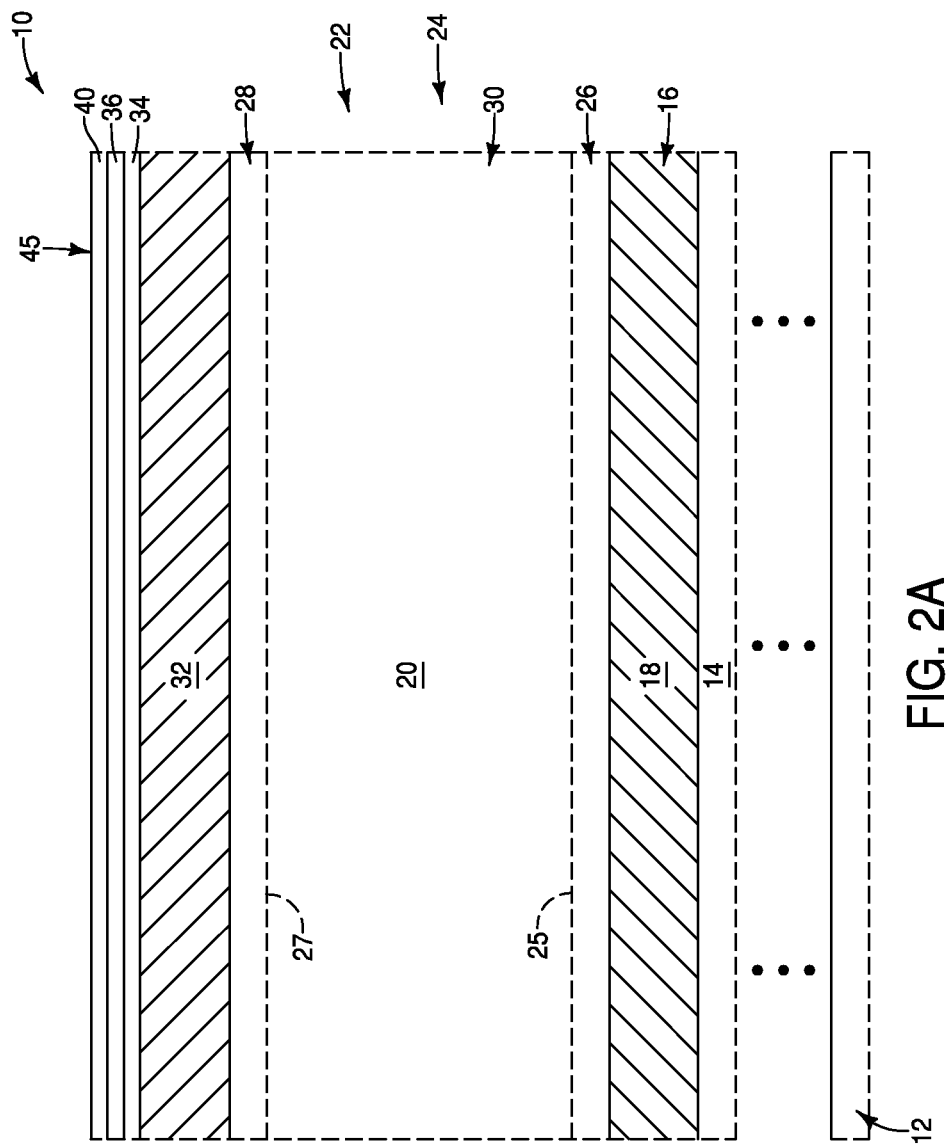
Figure 2B:
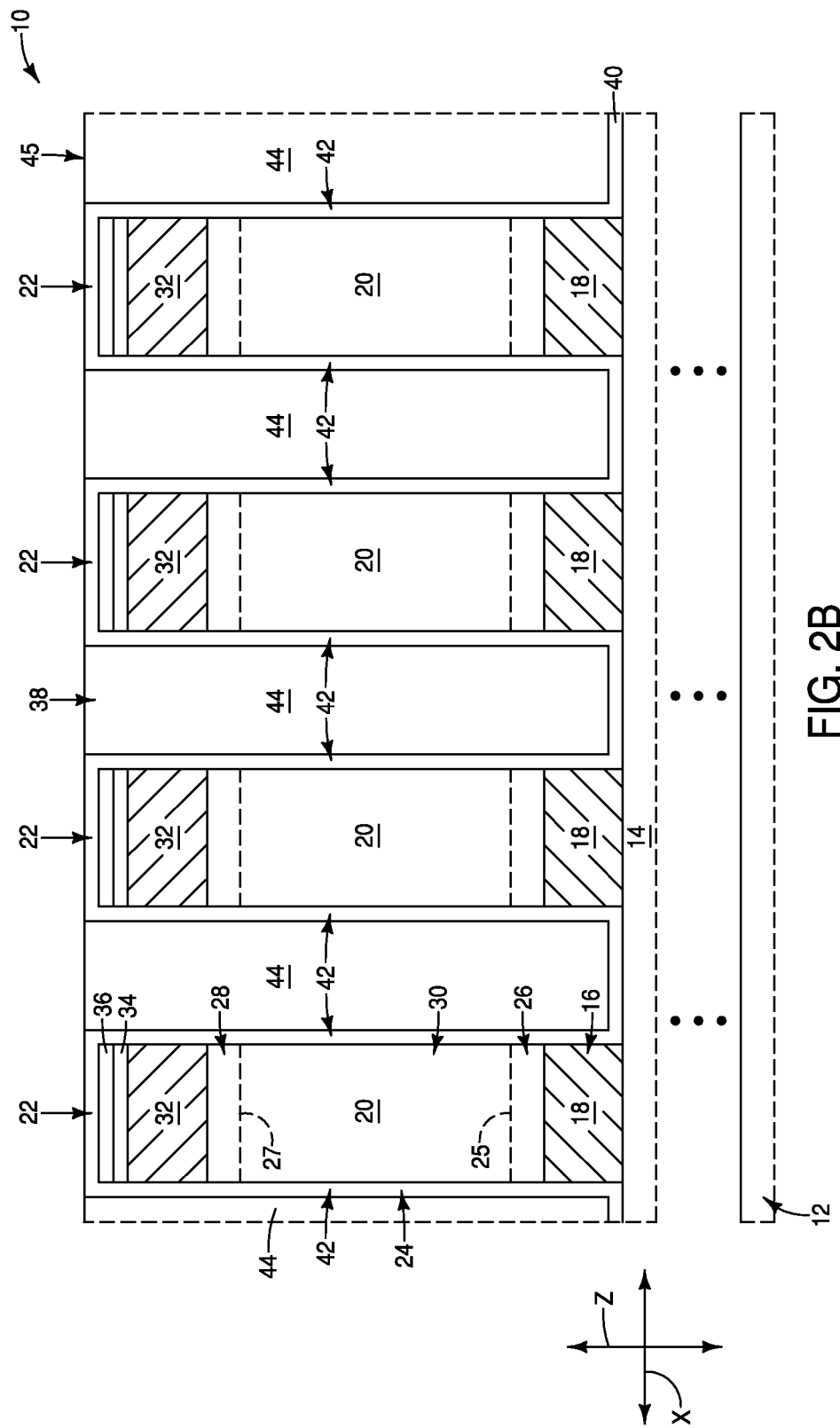

Referring to FIGS. 2-2B, a first material 40 is provided over the rails 22 and within the gaps 38. The first material 40 lines the rails 22, and may be considered to form rail-liners (linear-feature-liners) 42. The first material 40 may comprise any suitable composition(s); and in some embodiments may comprise, consist essentially of, or consist of carbon-doped silicon dioxide. The carbon-doped silicon dioxide may have any suitable carbon concentration; and in some embodiments may have a carbon concentration of at least about 1 atomic percent (at %), at least about 3 at %, at least about 5 at %, at least about 10 at %, etc. The first material 40 may be omitted in some embodiments.

A second material 44 is formed within the gaps 38, and specifically is provided over (along, adjacent) the rail-liners 42. The second material 44 may comprise electrically insulative material; and in some embodiments may comprise, consist essentially of, or consist of silicon dioxide.

A planarized upper surface 45 is formed across the materials 40 and 44. Such planarized surface may be formed with any suitable processing, including, for example, chemical-mechanical polishing (CMP).

Figure 3:
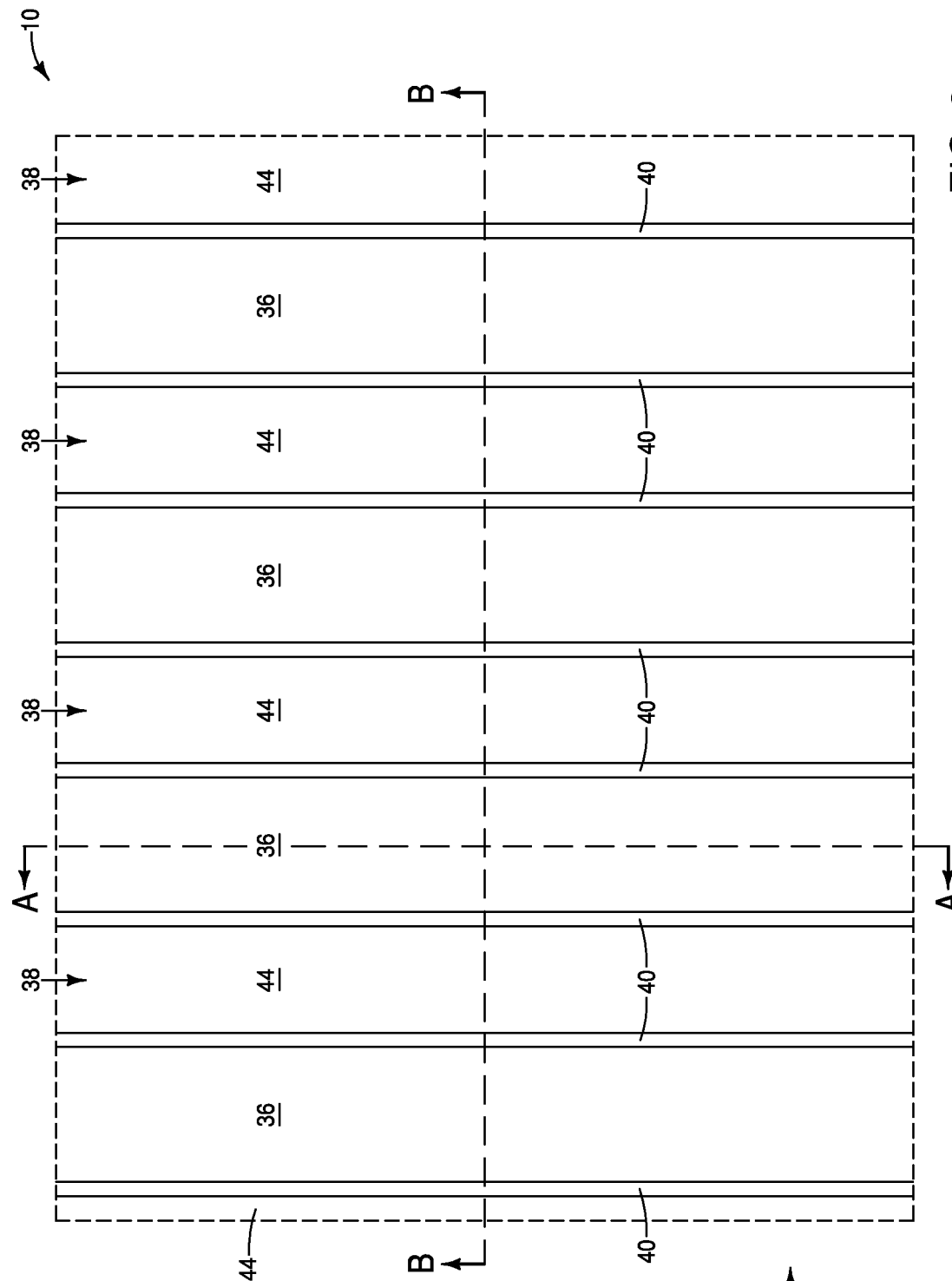
FIGS. 3-3B are diagrammatic views of the region of FIGS. 1-1B at an example process stage following that of FIGS. 2-2B.
Figure 3A:
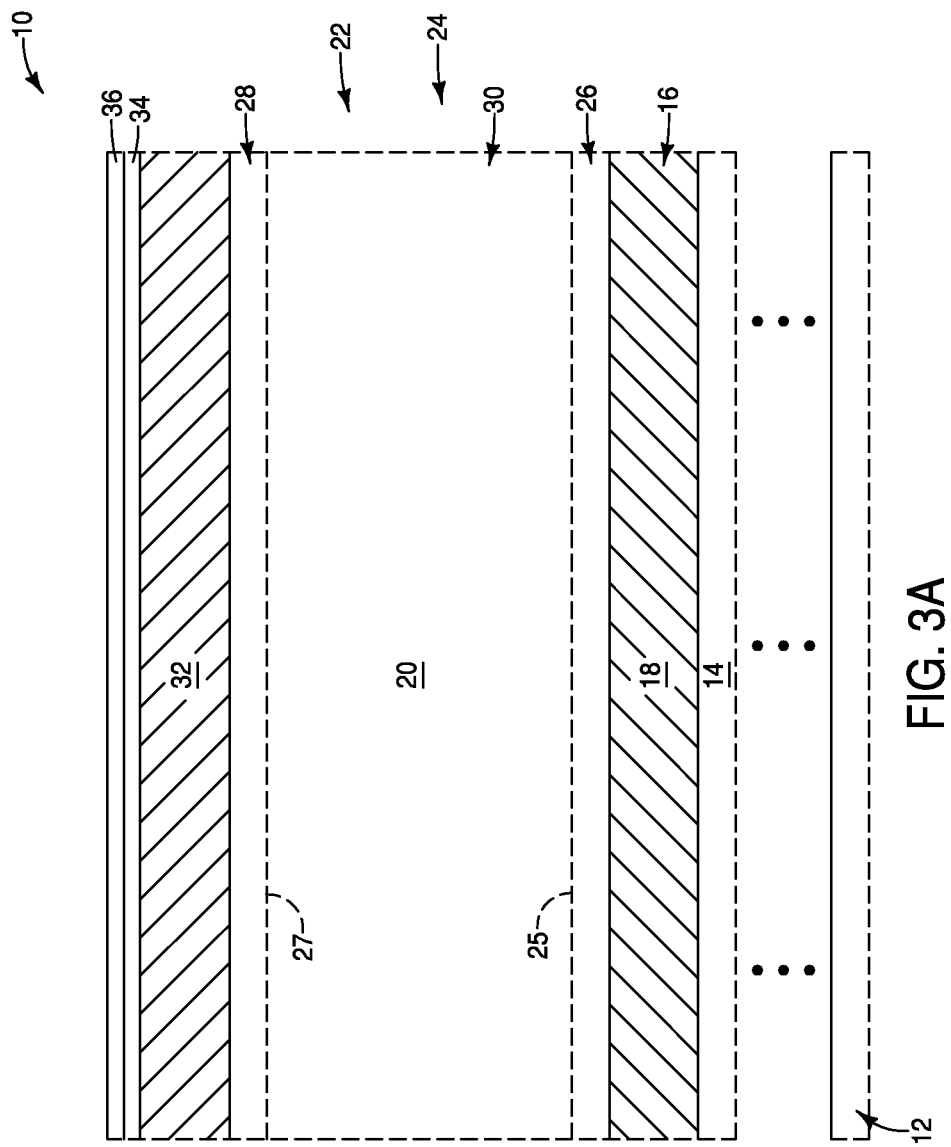
Figure 3B:
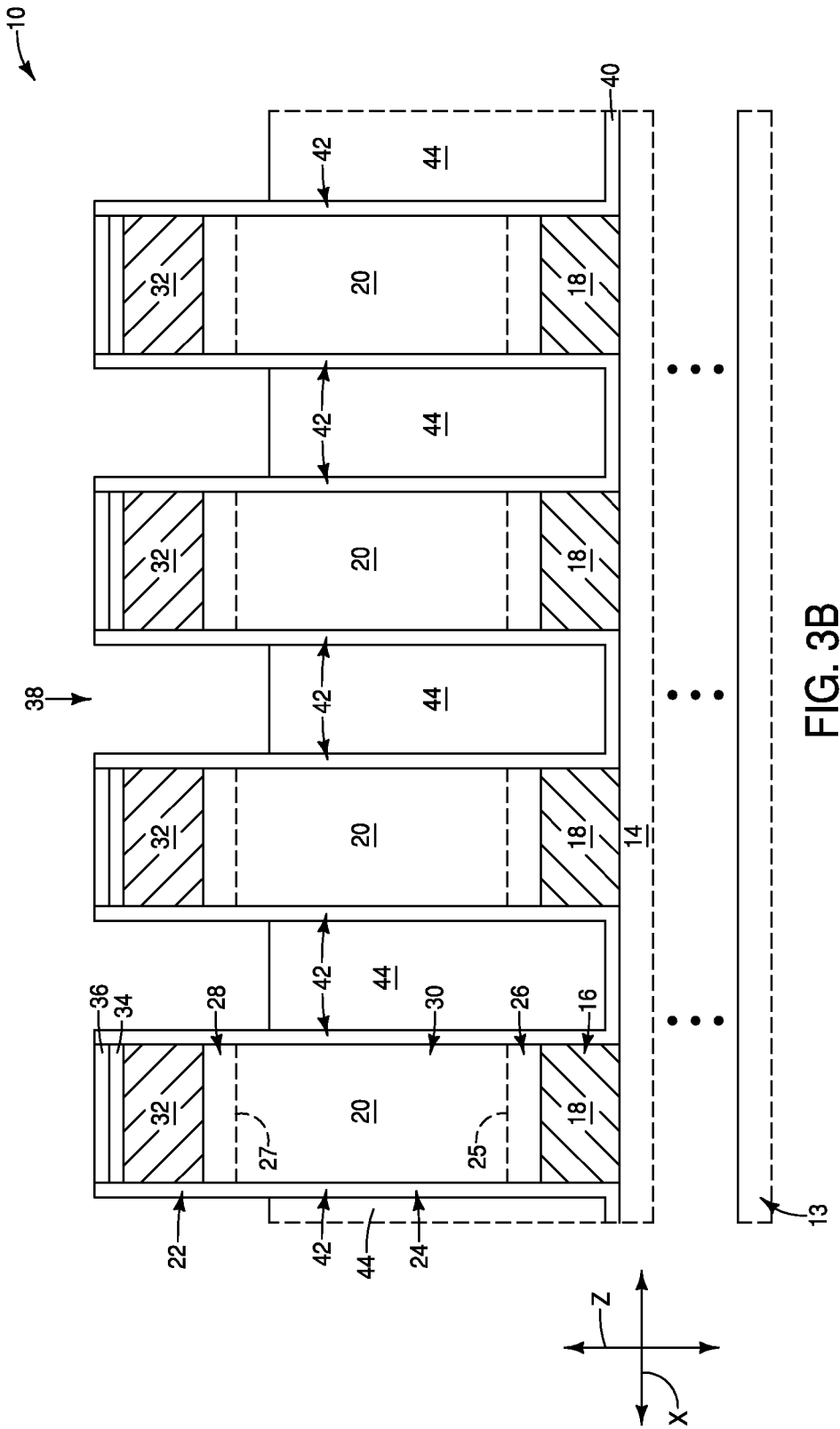

Referring to FIGS. 3-3B, the insulative material 44 is recessed into the gaps 38, and the first material 40 (e.g., carbon-doped silicon dioxide) is removed from over the material 36 (e.g., silicon nitride) of the rails 22. In some embodiments, the insulative material 44 comprises silicon dioxide, and such may be recessed with an etch selective for the silicon dioxide relative to the carbon-doped silicon dioxide of material 40. Subsequently, the material 40 may be subjected to an anisotropic etch to remove such material from over the tops of the rails 22.

Figure 4:
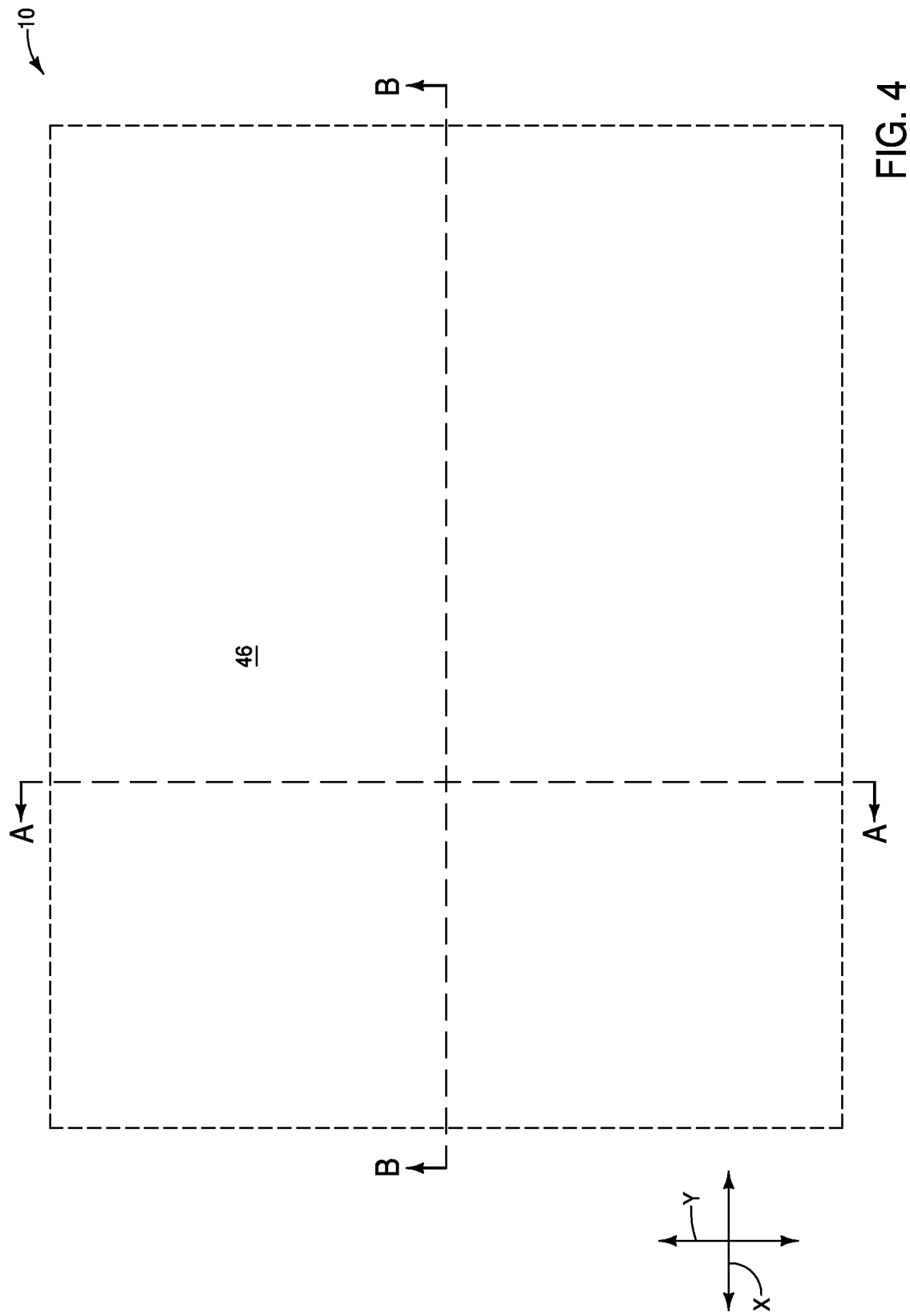
FIGS. 4-4B are diagrammatic views of the region of FIGS. 1-1B at an example process stage following that of FIGS. 3-3B.
Figure 4B:
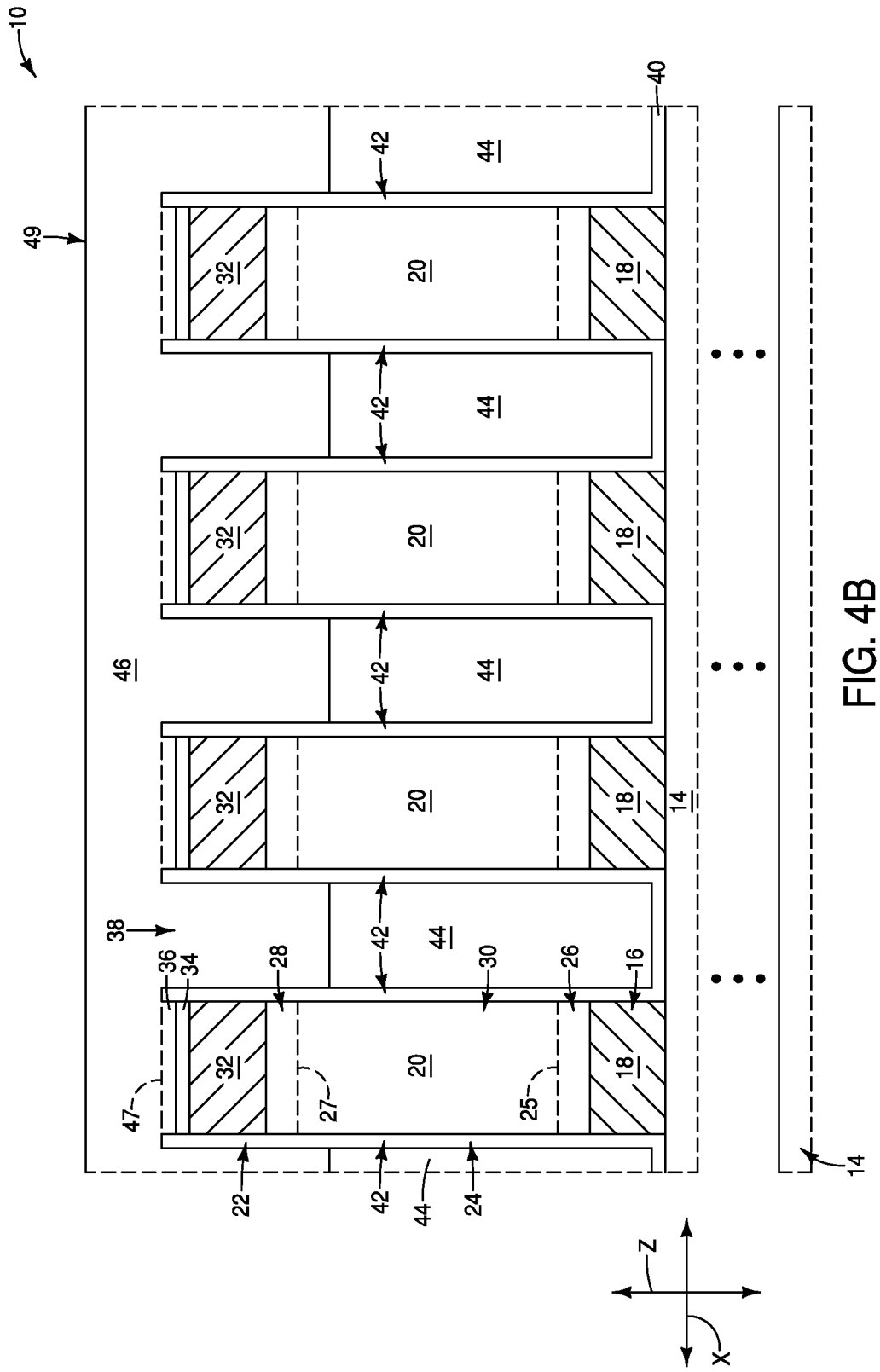

Referring to FIGS. 4-4B, a material 46 is formed within the gaps 38 and across the rails 22. In some embodiments, the material 46 comprises a same composition as the material 36, and accordingly dashed lines 47 are provided to indicate that the materials 36 and 46 may merge with one another. For instance, the materials 36 and 46 may both comprise, consist essentially of, or consist of silicon nitride.

The material 46 has a planarized upper surface 49. Such planarized surface may be formed with any suitable processing, including, for example, CMP.

Figure 5:
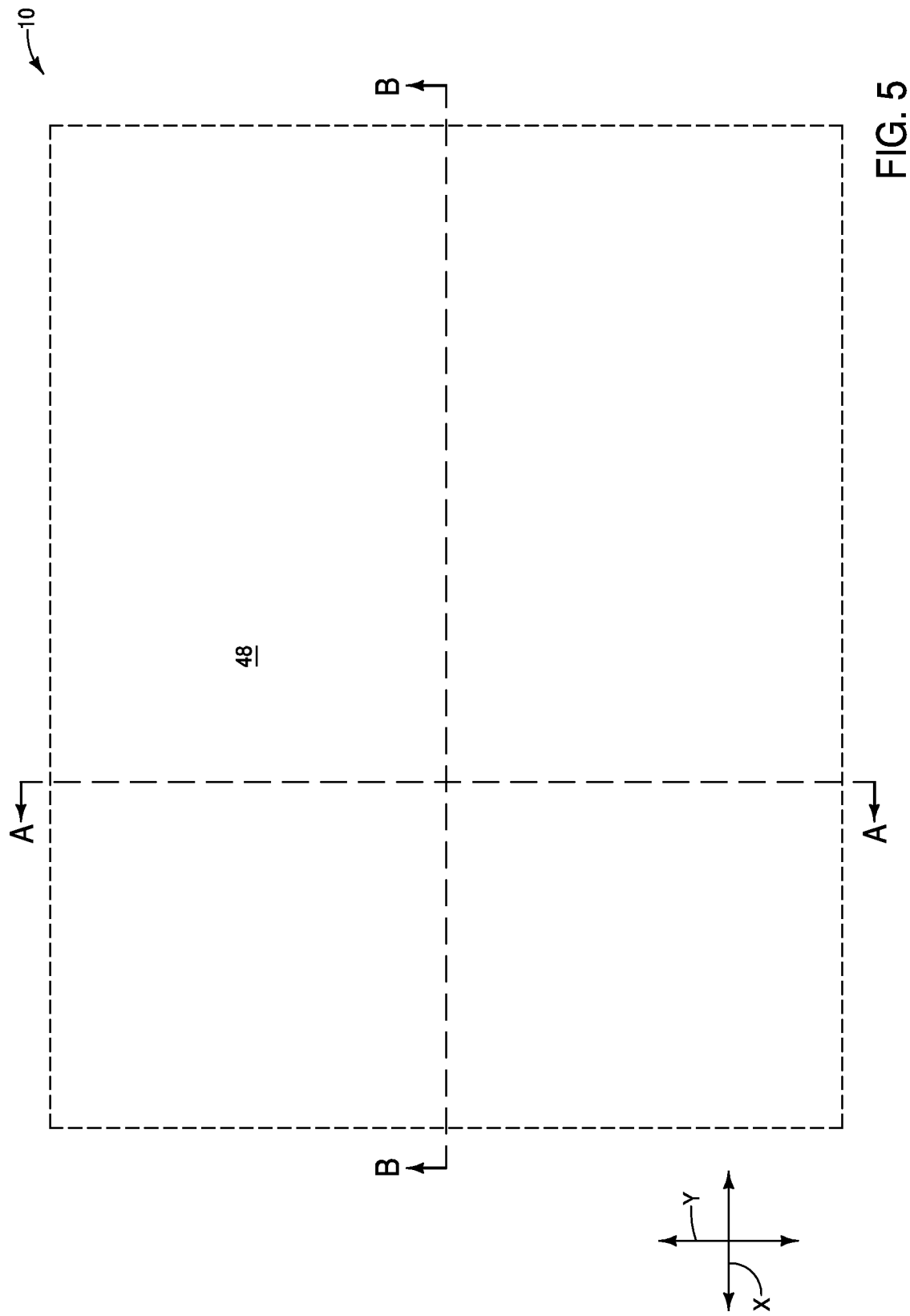
FIGS. 5-5B are diagrammatic views of the region of FIGS. 1-1B at an example process stage following that of FIGS. 4-4B.
Figure 5A:
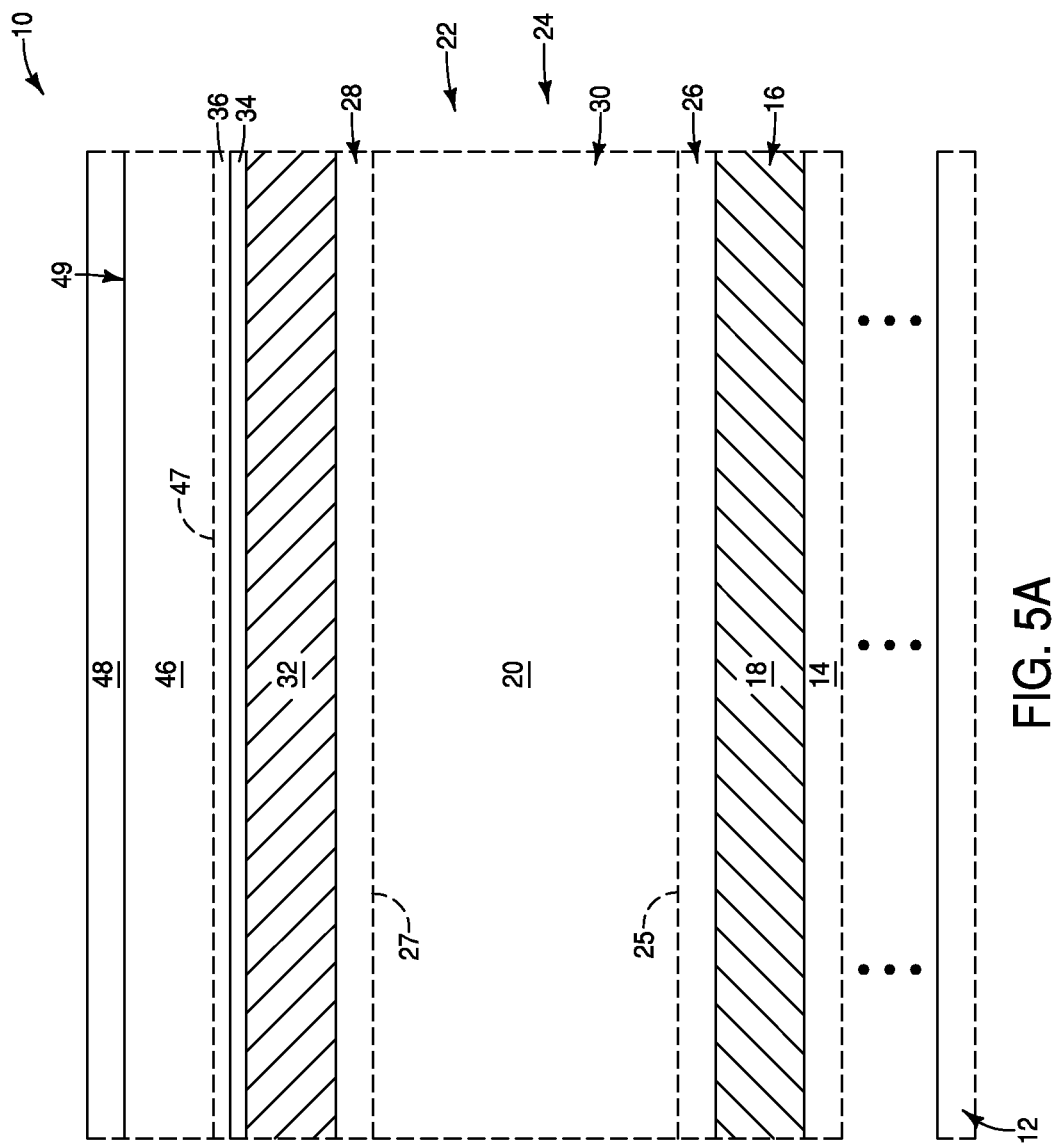
Figure 5B:
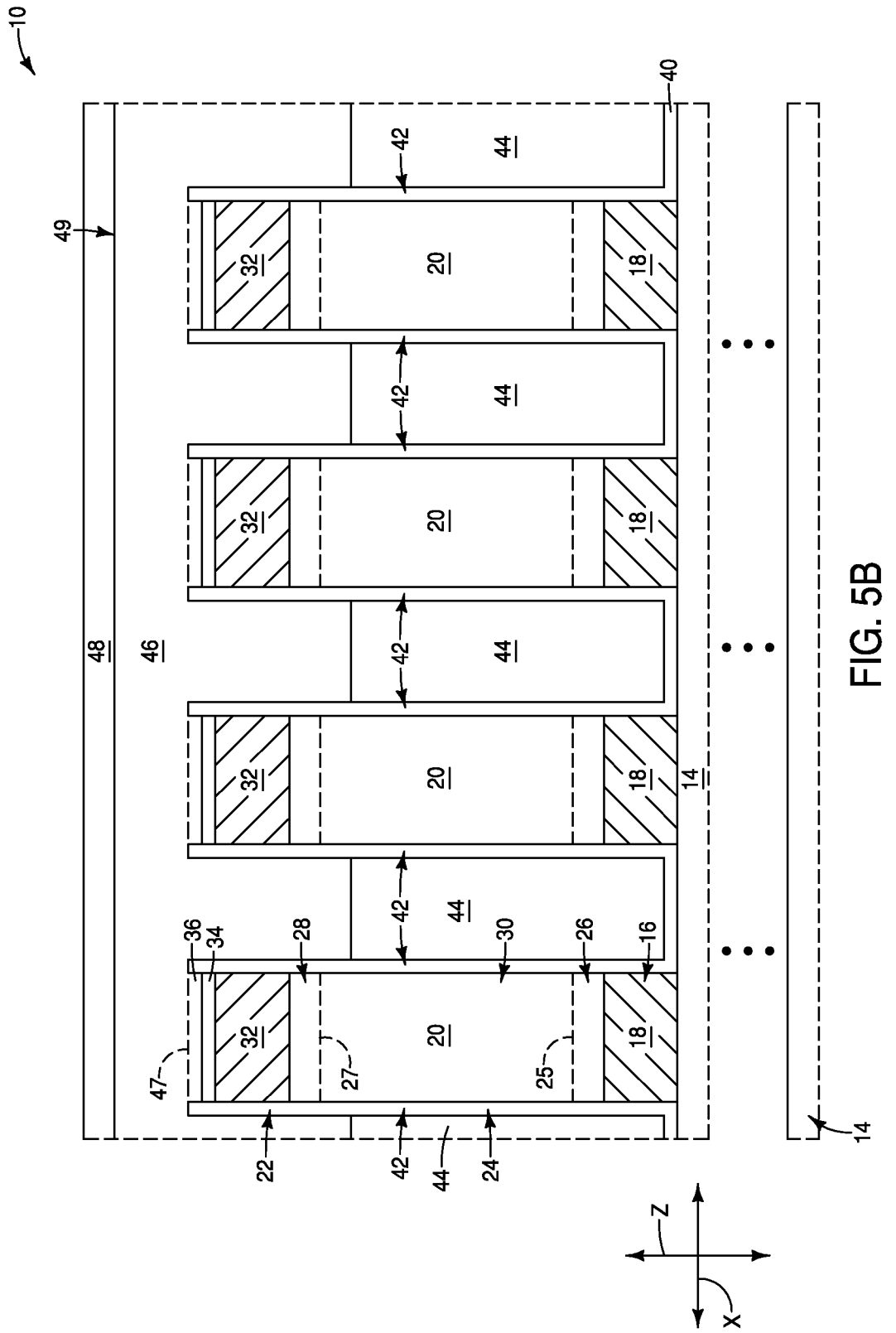

Referring to FIGS. 5-5B, a material 48 is formed over the planarized surface 49. In some embodiments, the material 48 may comprise, consist essentially of, or consist of silicon.

Figure 6:
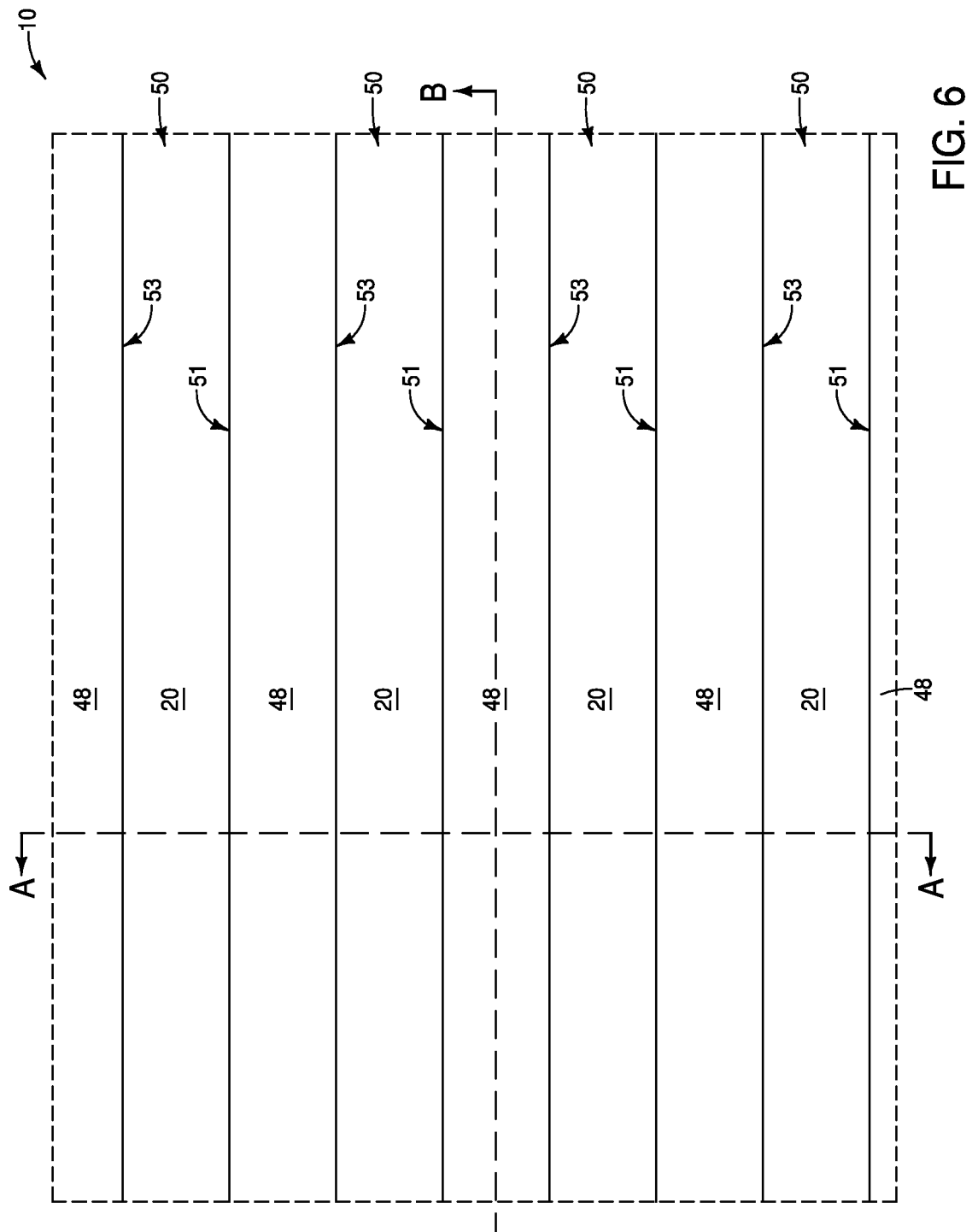
FIGS. 6-6B are diagrammatic views of the region of FIGS. 1-1B at an example process stage following that of FIGS. 5-5B.
Figure 6A:
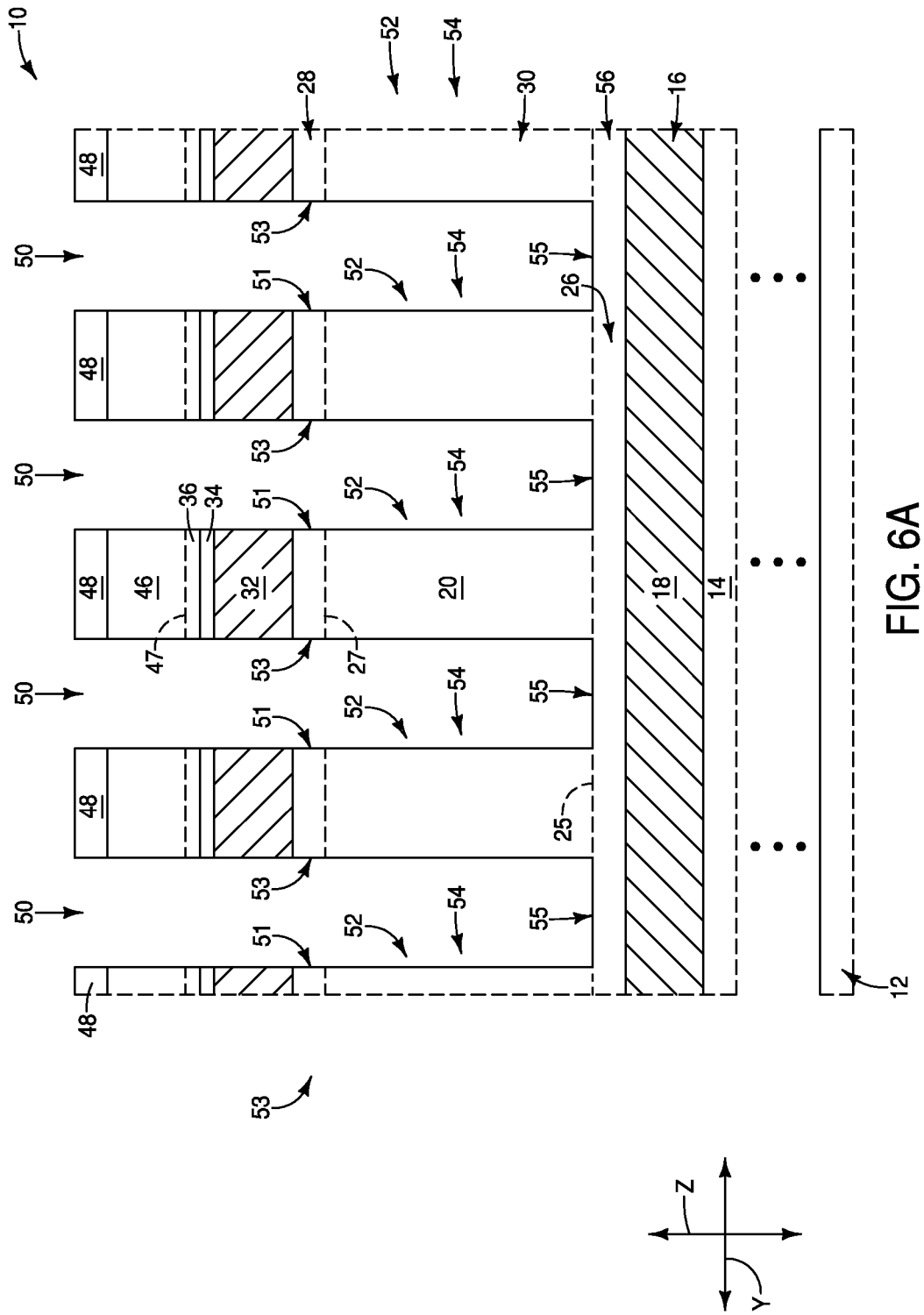
Figure 6B:
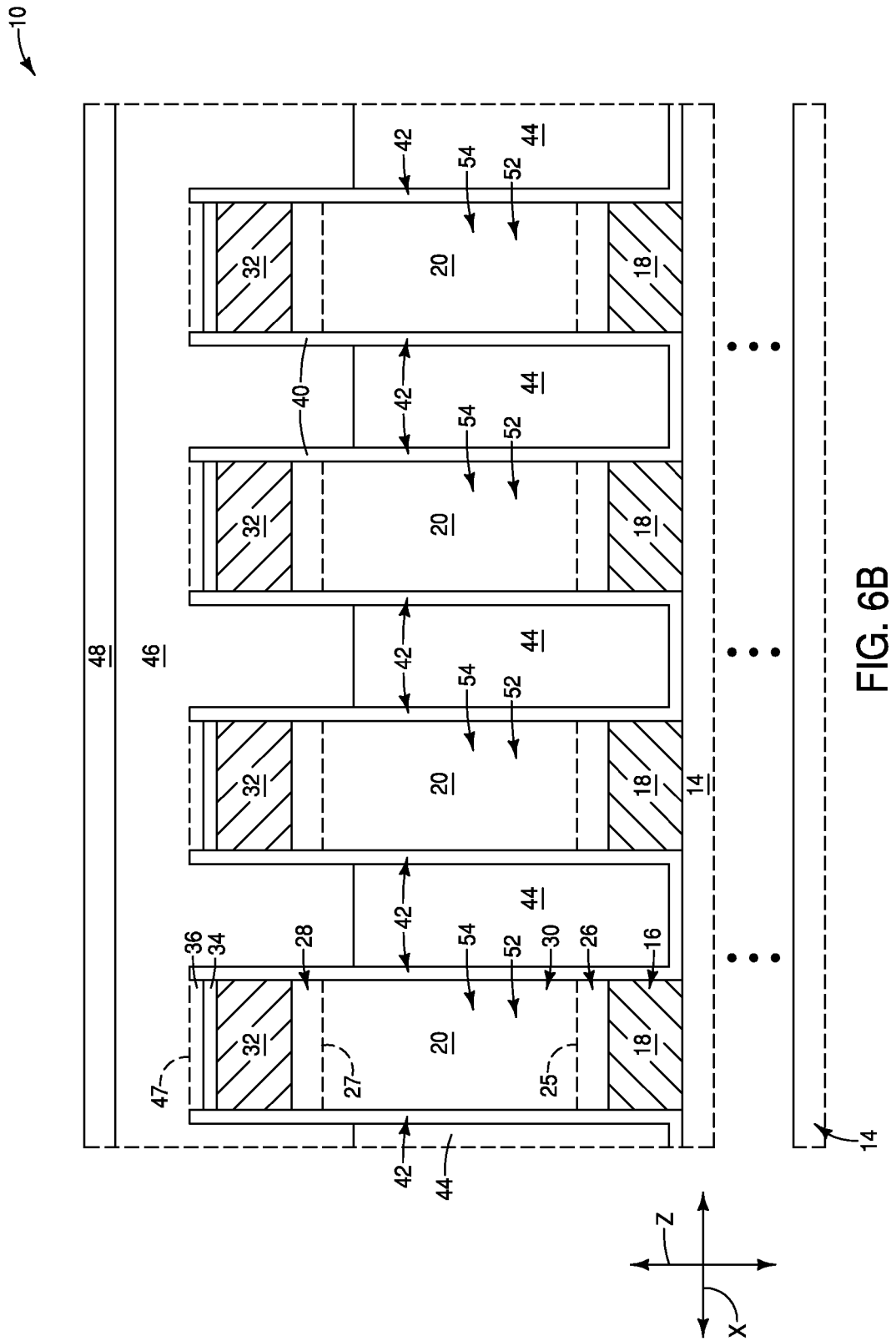

Referring to FIGS. 6-6B, trenches 50 are formed to extend into the rails 22 (FIGS. 5-5B), and through the insulative material 44. The trenches 50 extend along a second direction corresponding to an illustrated x-axis direction. The second direction (i.e., the x-axis direction) of the trenches crosses the first direction (i.e., the y-axis direction) of the rails 22. In the illustrated embodiment, the second direction of the trenches is orthogonal to the first direction of the rails. In other embodiments, the second direction of the trenches may cross the first direction of the rails without being orthogonal to such first direction.

The trenches 50 extend into the semiconductor-material-linear-configurations 24 (FIGS. 5-5B), and do not break the digit lines 16 (as shown in FIG. 6A). The trenches 50 may or may not extend into the doped region 26. The illustrated trenches 50 have first sides 51, opposing second sides 53, and bottom regions 55.

The trenches 50 pattern semiconductor-material-structures 52 from the semiconductor-material-linear-configurations 24 (with an example linear-configuration 24 being shown in, for example, FIG. 5A). The semiconductor-material-structures 52 include semiconductor-material-pillars 54, with such pillars extending upwardly from a semiconductor-material-base 56. The semiconductor-material-pillars include upper source/drain regions 28, and channel regions 30 below the upper source/drain regions. The pillars 54 may or may not also include portions of the lower source/drain regions 26. In the illustrated embodiment, the base 56 includes the majority of the lower source/drain regions 26. In other embodiments, the trenches 50 may extend entirely through the semiconductor material 20 so that the lower source/drain regions 26 are within the pillars 54, and the base 56 is essentially nonexistent.

Figure 7:
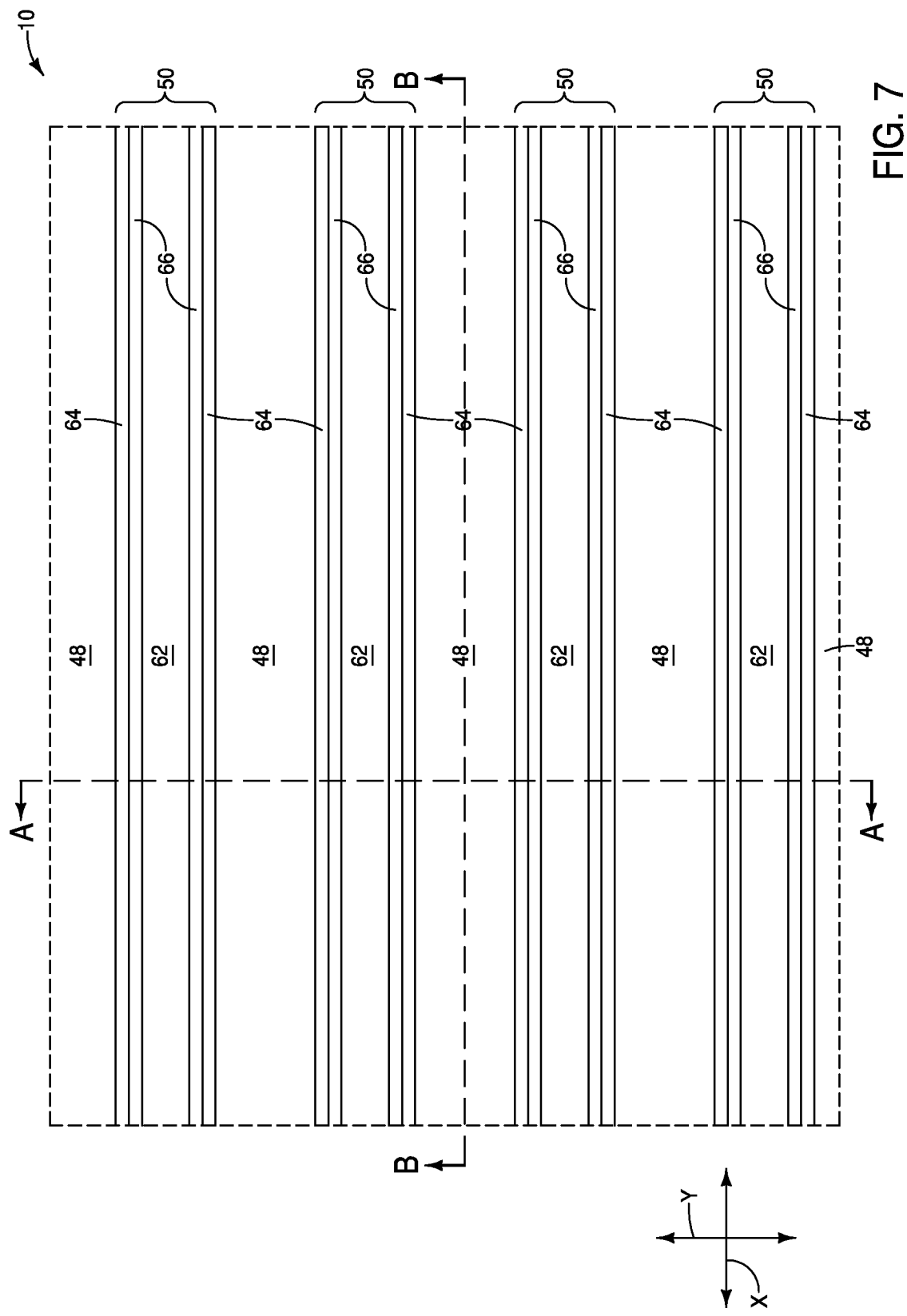
FIGS. 7-7B are diagrammatic views of the region of FIGS. 1-1B at an example process stage following that of FIGS. 6-6B.
Figure 7A:
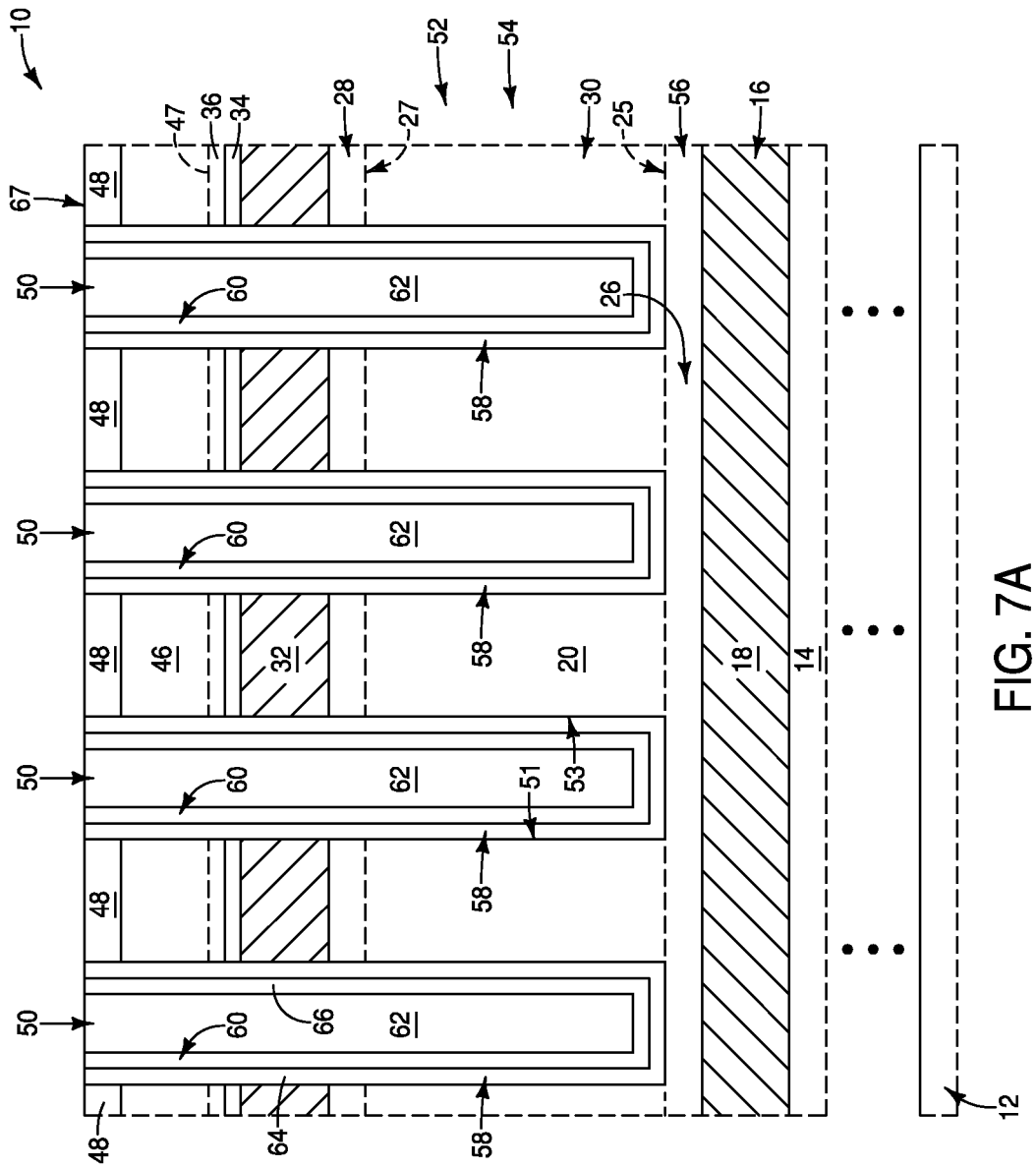
Figure 7B:
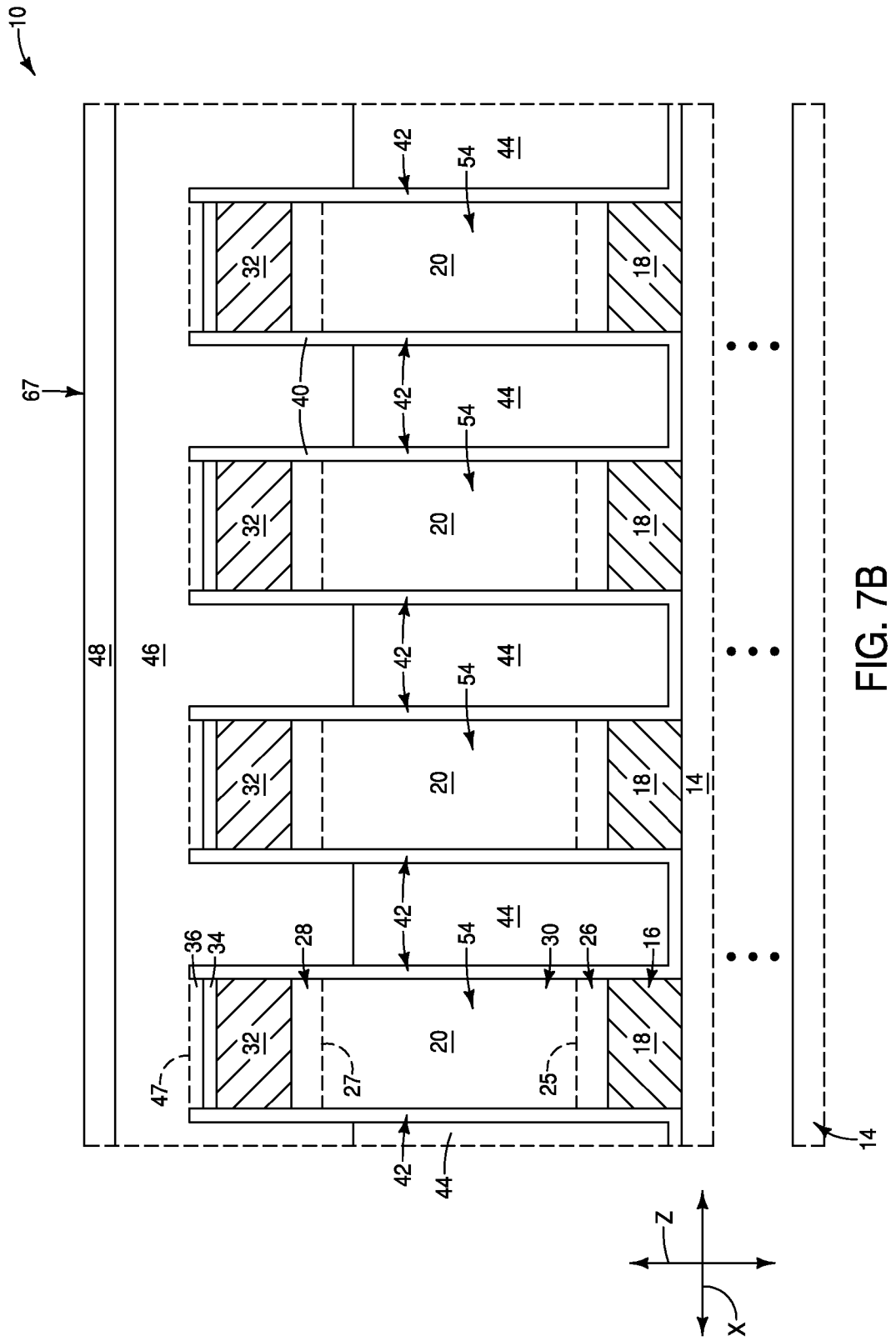

Referring to FIGS. 7-7B, first-material-liners 58 are formed within the trenches 50, and second-material-liners 60 are formed over the first-material-liners. The first-material-liners 50 and second-material-liners 60 partially fill the trenches 50. Fill material 62 is formed within the remaining portions (regions) of the partially-filled trenches.

The first-material-liners 58 comprise a first-liner-material (first material) 64. The first-liner-material 64 may comprise any suitable composition(s); and in some embodiments may comprise, consist essentially of, or consist of carbon-doped silicon dioxide. Accordingly, in some embodiments the first-liner-material 64 may comprise a same composition as the rail-liner-material 40 of the rail-liners 42. In some embodiments, the carbon-doped silicon dioxide of the first-liner-material 64 may have a carbon concentration of at least about 1 atomic percent, at least about 3 at %, at least about 5 at %, at least about 10 at %, etc.

The second-material-liners 60 comprise a second-liner-material (second material) 66. The second-liner-material 66 may comprise any suitable composition(s); and in some embodiments may comprise, consist essentially of, or consist of silicon nitride.

The fill material 62 may comprise any suitable composition(s); and in some embodiments may comprise, consist essentially of, or consist of silicon dioxide. The material 62 may be formed as a spin-on dielectric (SOD), or as a spin-on glass (SOG).

A planarized surface 67 extends across the materials 48, 62, 64 and 66. The planarized surface 67 may be formed with any suitable processing (e.g., CMP).

Figure 8A:
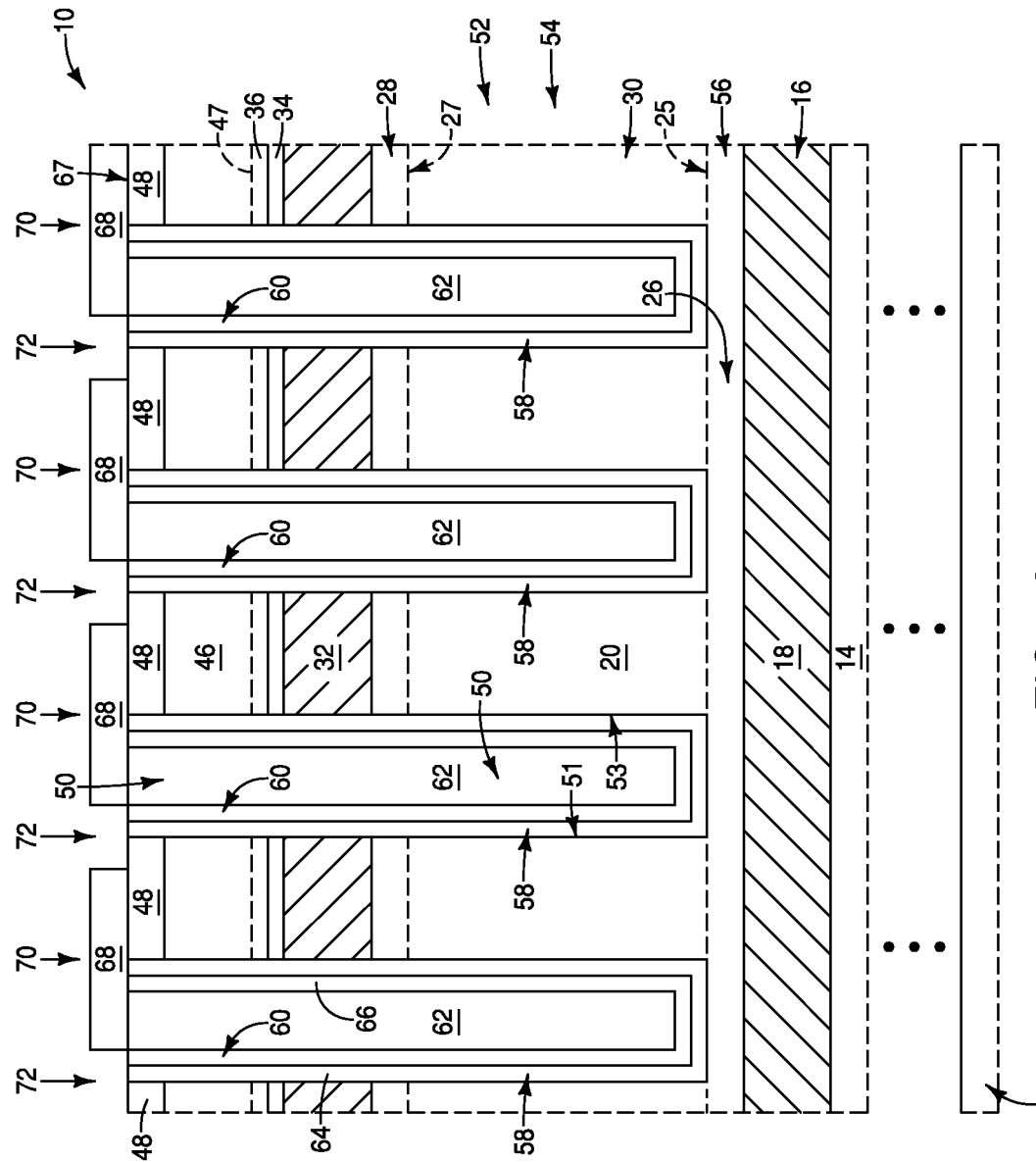
Figure 8B:
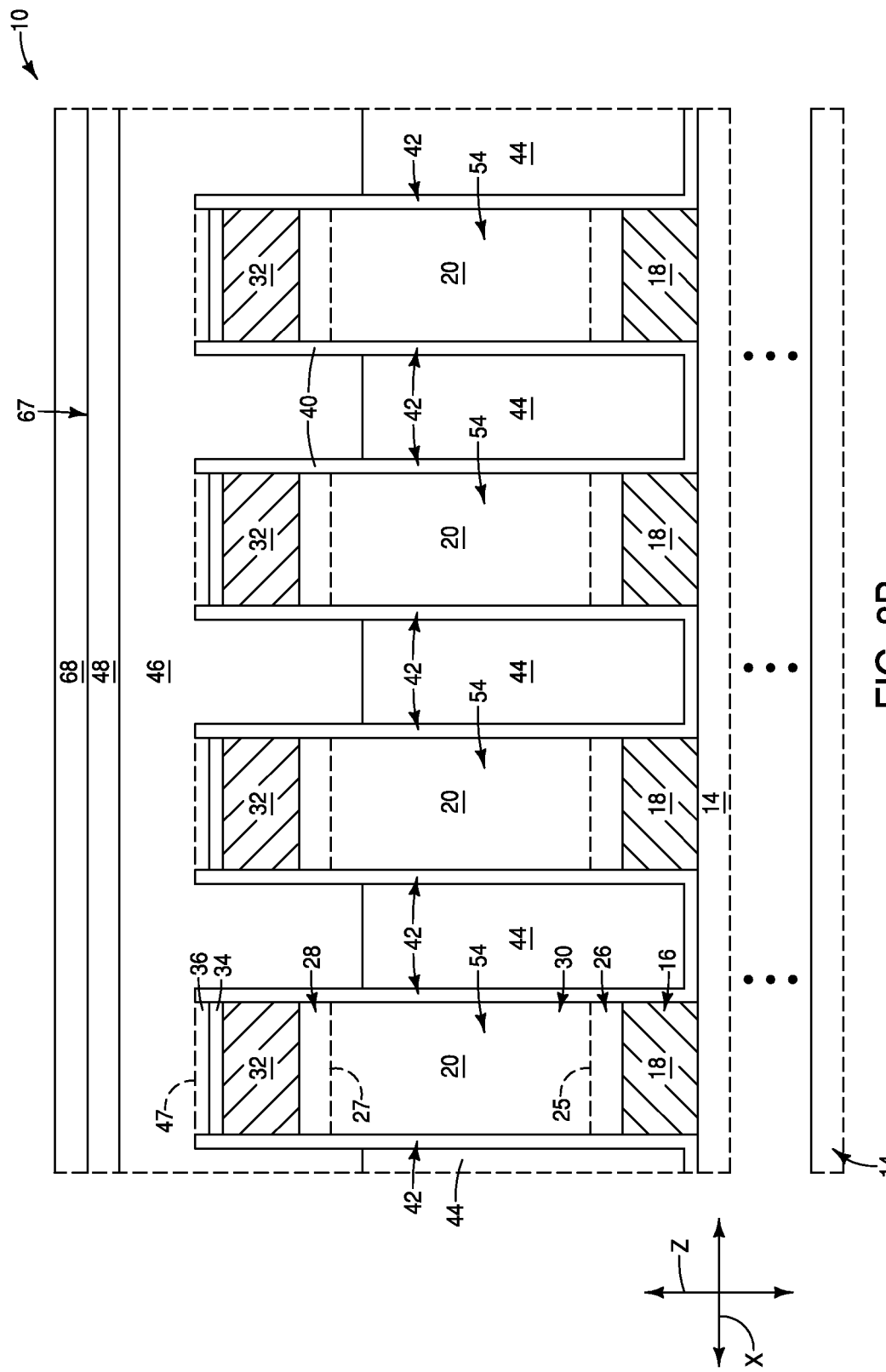

Referring to FIGS. 8-8B, masking material 68 is formed over the planarized surface 67, and is patterned into segments 70. Gaps 72 are between the segments 70. The masking material 68 may comprise any suitable composition(s); and in some embodiments may comprise, consist essentially of, or consist of one or both of silicon dioxide and photoresist.

The regions of the second-material-liners 66 along the first sides 51 of the trenches 50 are exposed within the gaps 72. In some embodiments, the masking material 68 and the semiconductor material 48 may be considered together to form a hard mask, and regions of the second-material-liners 66 may be considered to be exposed within windows through such hard mask.

Figure 9:
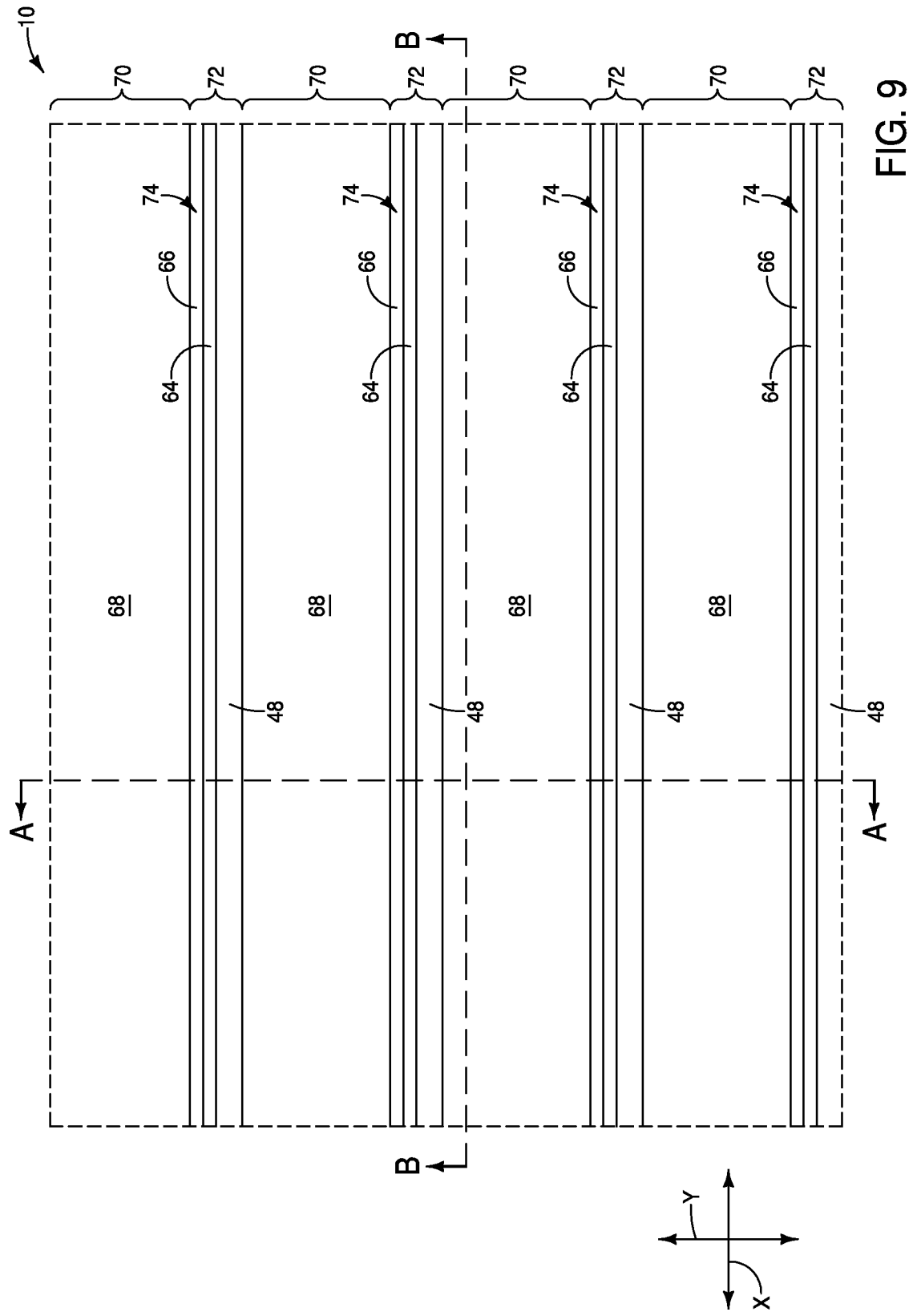
FIGS. 9-9B are diagrammatic views of the region of FIGS. 1-1B at an example process stage following that of FIGS. 8-8B.
Figure 9A:
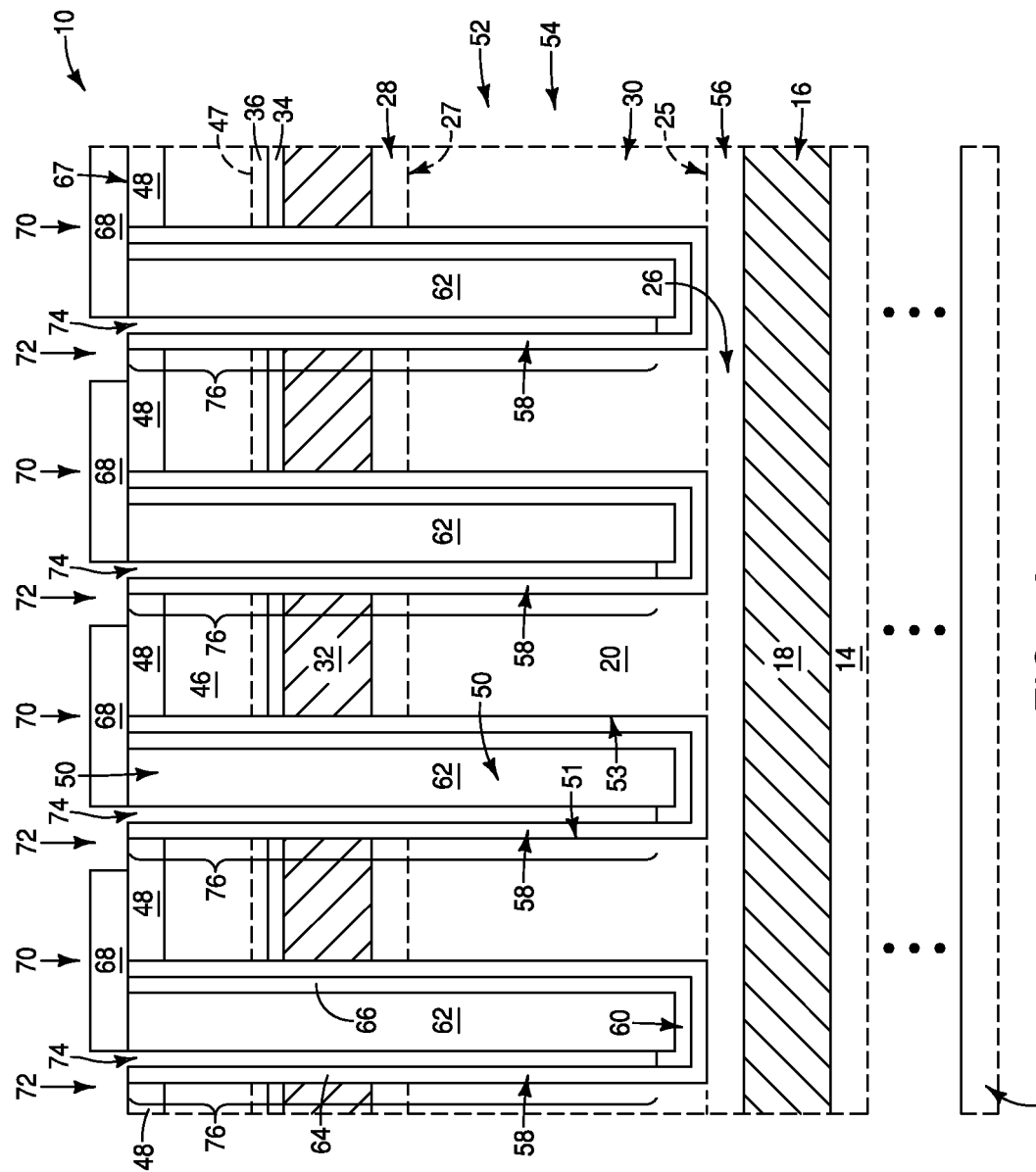
Figure 9B:
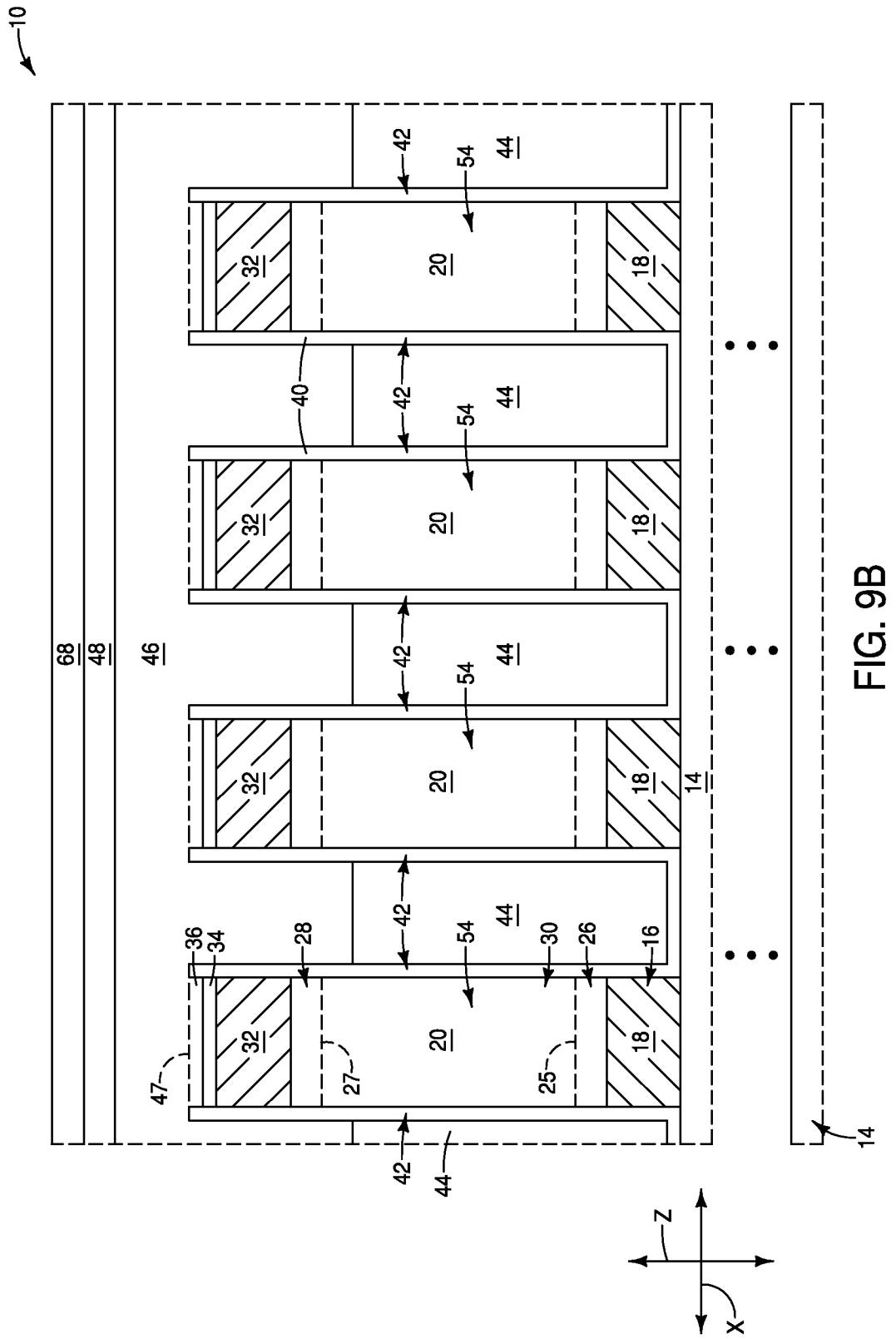

Referring to FIGS. 9-9B, the second-material-liners 60 are recessed along the first sides 51 of the trenches 50. The masking material 68 protects the second-material-liners 60 along the second sides 53 of the trenches so that the second-material-liners 60 are not recessed along the second sides of the trenches.

The recessing of the second-material-liners 60 forms openings 74 along the first-material-liners 58 at the first sides 51 of the trenches 50. The openings 74 may be formed to any suitable depth. In some embodiments, bottom regions of the openings 74 define approximate locations for transistor gates which are formed at subsequent process stages.

Segments (regions) 76 of the first-material-liners 58 are exposed along the openings 74.

Figure 10:
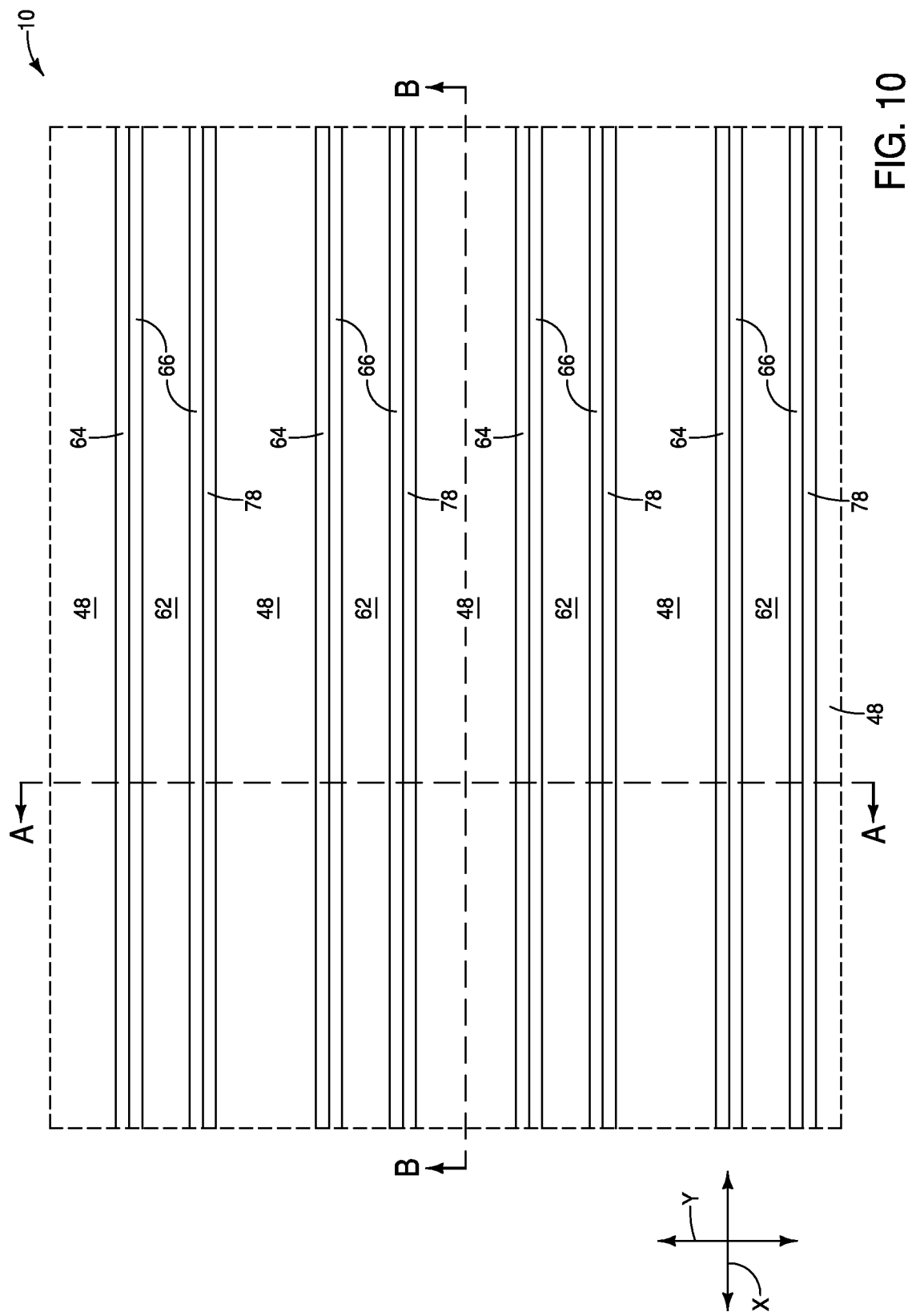
FIGS. 10-10B are diagrammatic views of the region of FIGS. 1-1B at an example process stage following that of FIGS. 9-9B.
Figure 10A:
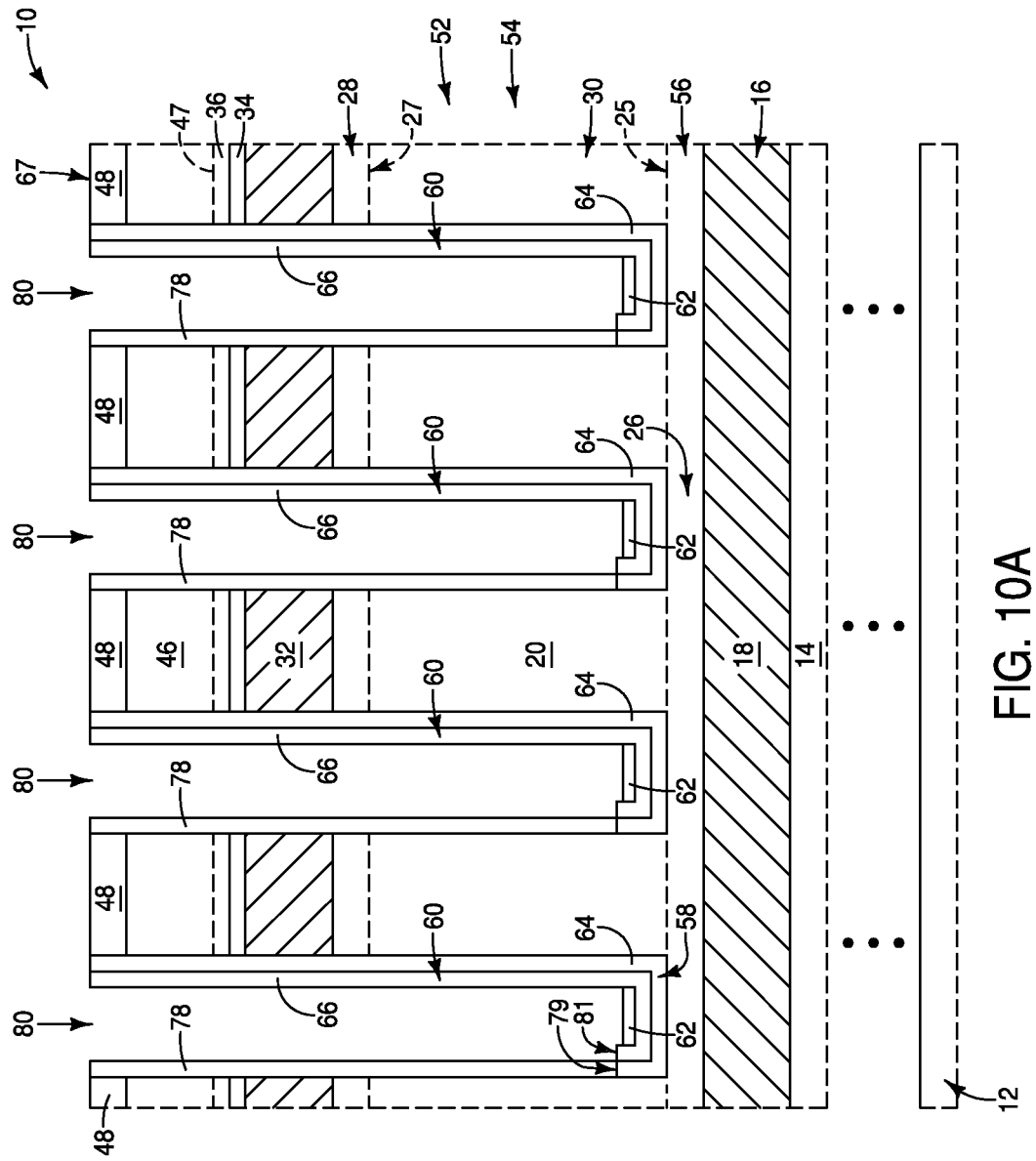
Figure 10B:
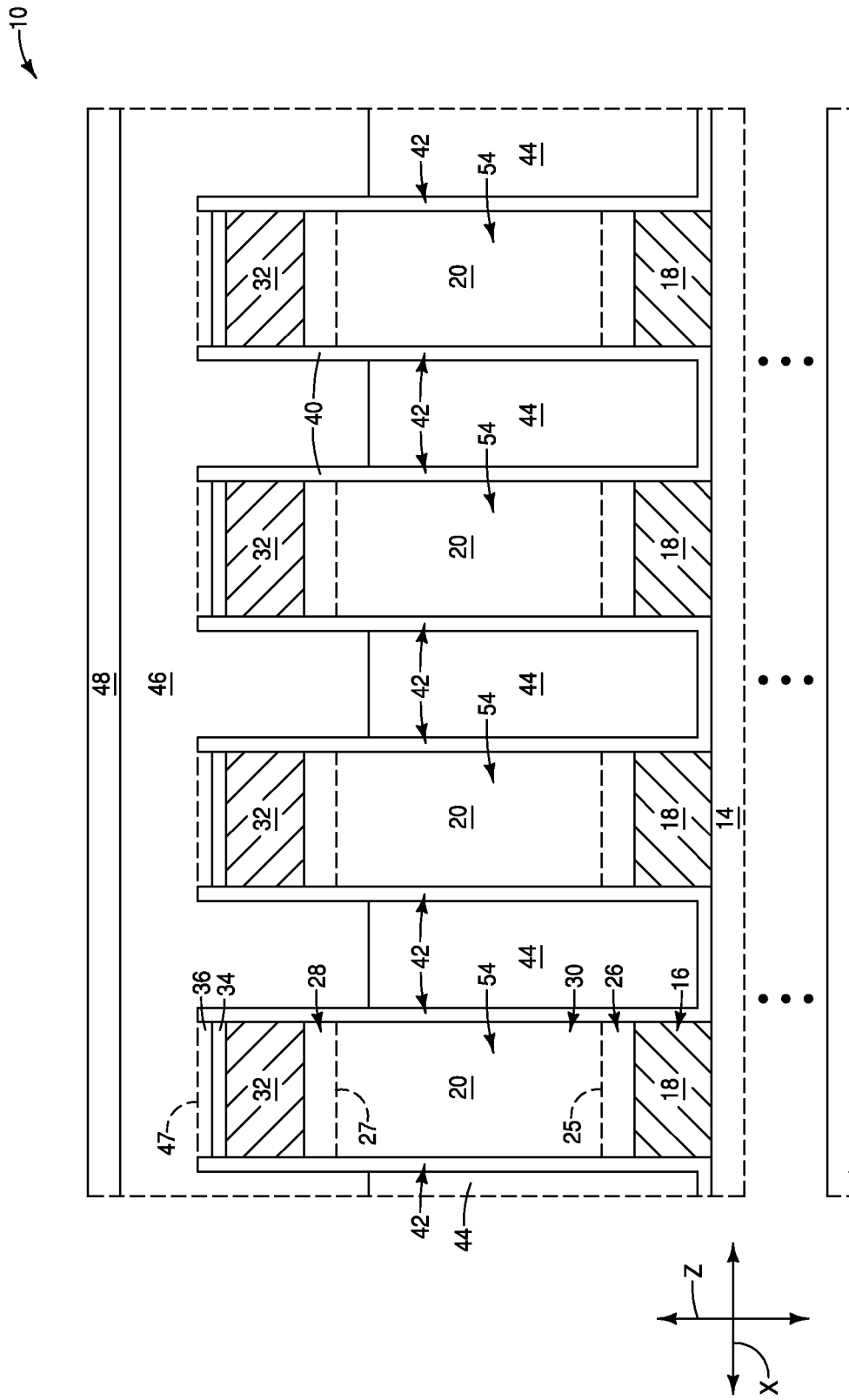

Referring to FIGS. 10-10B, the exposed segments (regions) 76 (FIGS. 9-9B) of the first-material-liners 58 are converted to insulative material 78 suitable for utilization as gate-dielectric-material. The insulative material 78 may comprise any suitable composition(s); and in some embodiments may comprise, consist essentially of, or consist of silicon dioxide. In some embodiments, the exposed segments 76 of the first-material-liners 58 are removed and replaced with the insulative material 78. In other embodiments, the material 64 of the first-material-liners 58 comprises carbon-doped silicon dioxide, and such material is oxidized to convert it to silicon dioxide and thereby form at least some of the insulative material 78 from the material 64 of the first-material-liners 58.

In the illustrated embodiment, the material 78 has an interface 79 with the material 64 of the first-material-liners 58 which is about coextensive with an upper surface 81 of the recessed material 66 of the second-material-liners 60. In other embodiments, the interface 79 may be beneath the upper surface 81.

The masking material 68 (FIGS. 9-9B) is removed, and subsequently the fill material 62 is recessed to form trenches 80. In some embodiments, the fill material 62 comprises silicon dioxide and is recessed with a wet oxide etch. The fill material 62 may be recessed to any suitable level within the trenches 80, and in some embodiments may be entirely removed. The trenches 80 are coextensive with the trenches 50 of FIGS. 6-6B, but are narrower than the trenches 50. In some embodiments, the narrow trenches 80 may be considered to be regions of the trenches 50.

Figure 11:
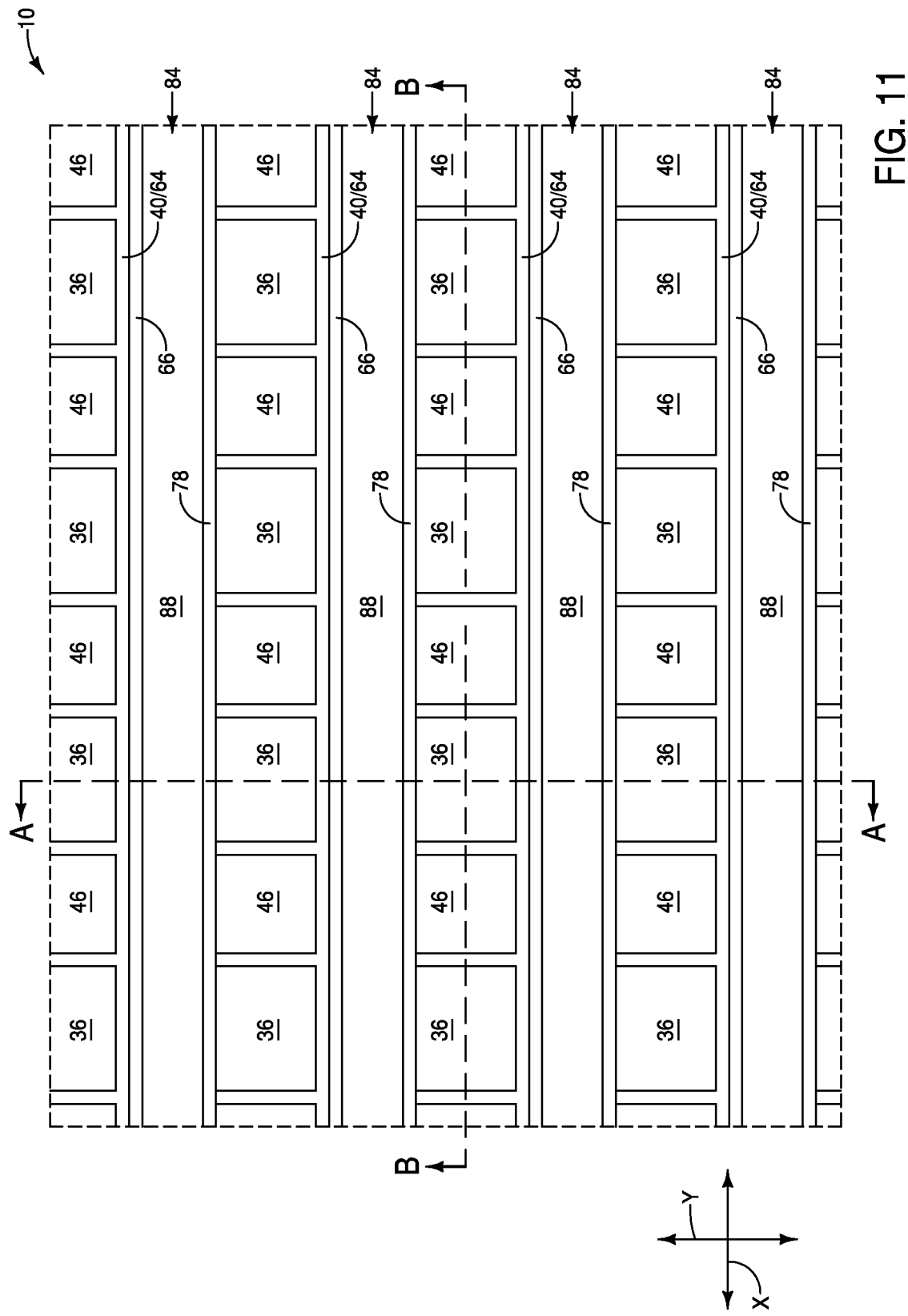
FIGS. 11-11B are diagrammatic views of the region of FIGS. 1-1B at an example process stage following that of FIGS. 10-10B.
Figure 11A:
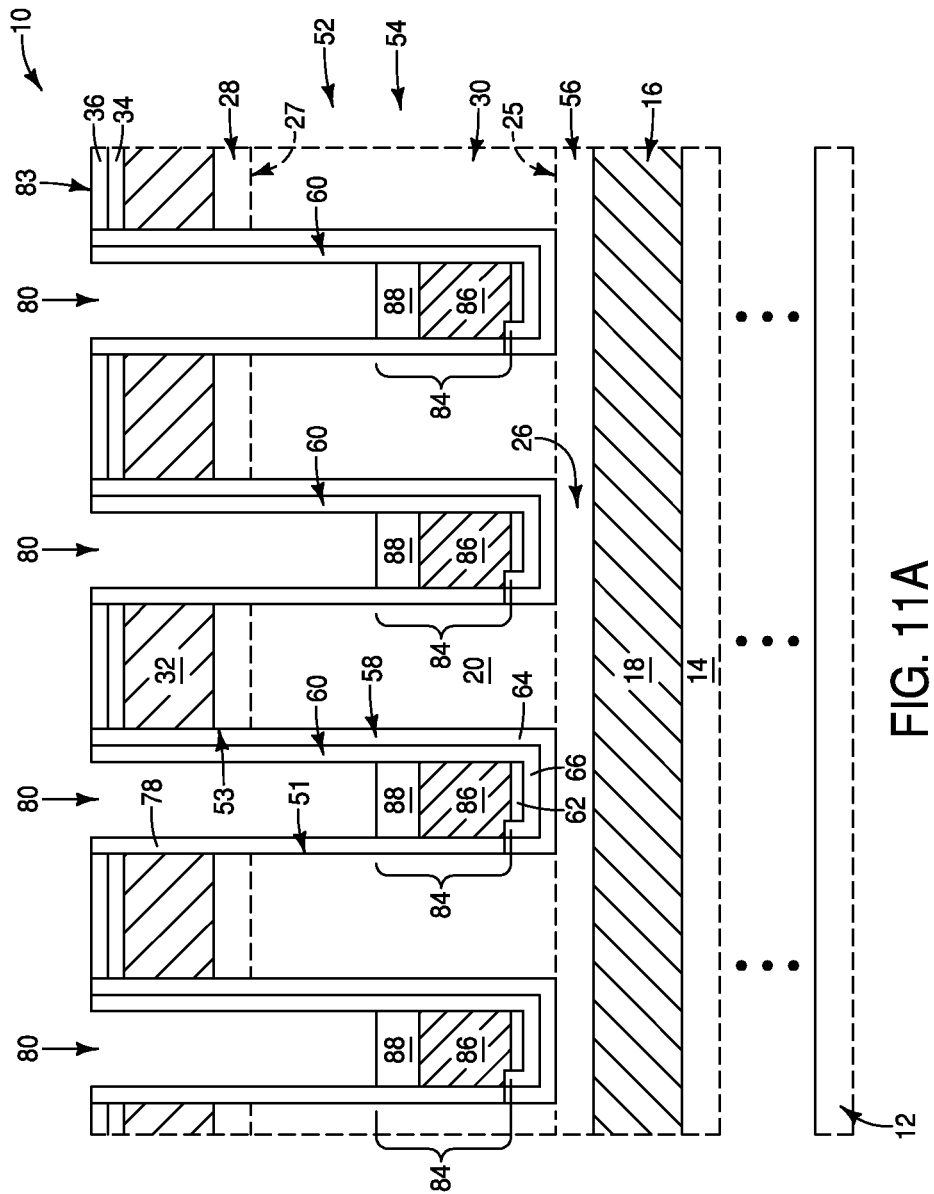
Figure 11B:
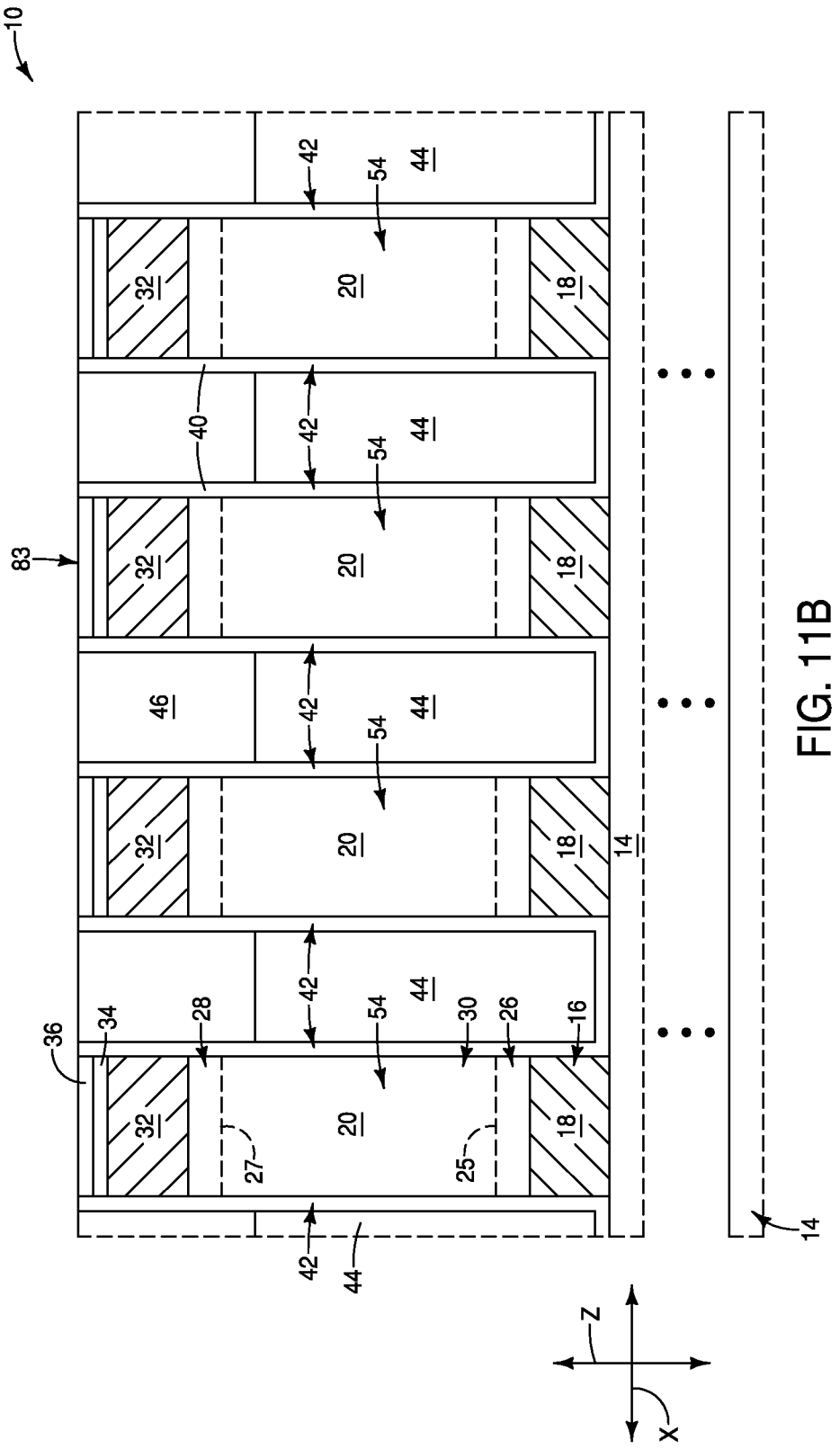

Referring to FIGS. 11-11B, an upper surface of the assembly 10 is planarized to remove materials 46 and 48 from over material 36, and form the planarized upper surface 83 exceeding across materials 36, 46, 64, 66 and 78. In some embodiments, sacrificial material may be formed within the trenches 80 during such planarization, and then the sacrificial material may be removed subsequent to the planarization.

Wordlines (gate lines) 84 are formed within the trenches 80 and over the recessed-second-material-liners 60. In the illustrated embodiment, the wordlines comprise two materials 86 and 88; with the material 86 being a metal-containing material and the material 88 being conductively-doped silicon. The metal-containing material 86 may comprise any suitable composition(s); including, for example, one or more of tungsten, titanium, tungsten nitride, titanium nitride, tungsten silicide, titanium silicide, etc. The materials 86 and 88 have different work functions relative to one another, and accordingly the illustrated wordlines 84 may be considered to be dual-workfunction wordlines. In other embodiments, the wordlines may comprise other configurations, and may or may not have dual-workfunction configurations.

The wordlines 84 extend along the illustrated x-axis direction, and accordingly cross the digit lines 16. In some embodiments, the wordlines 84 may be considered to be representative of conductive structures which extend along the x-axis direction.

The wordlines comprise gates along the channel region 30 of the pillars 52.

The top view of FIG. 11 shows a configuration in which the materials 40 and 64 are a same composition as one another, and merge to form a composition 40/64.

Figure 12:
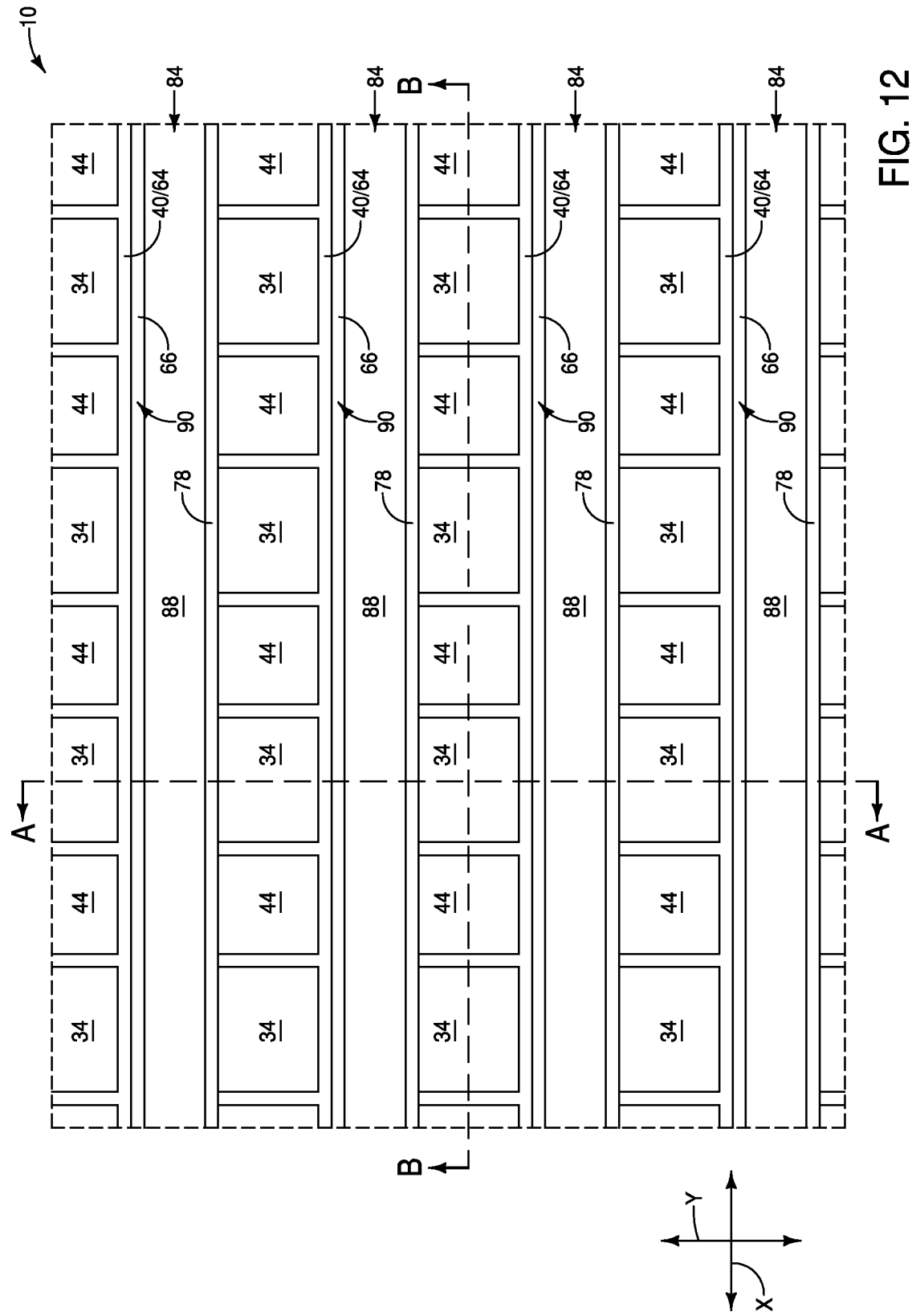
FIGS. 12-12B are diagrammatic views of the region of FIGS. 1-1B at an example process stage following that of FIGS. 11-11B.
Figure 12A:
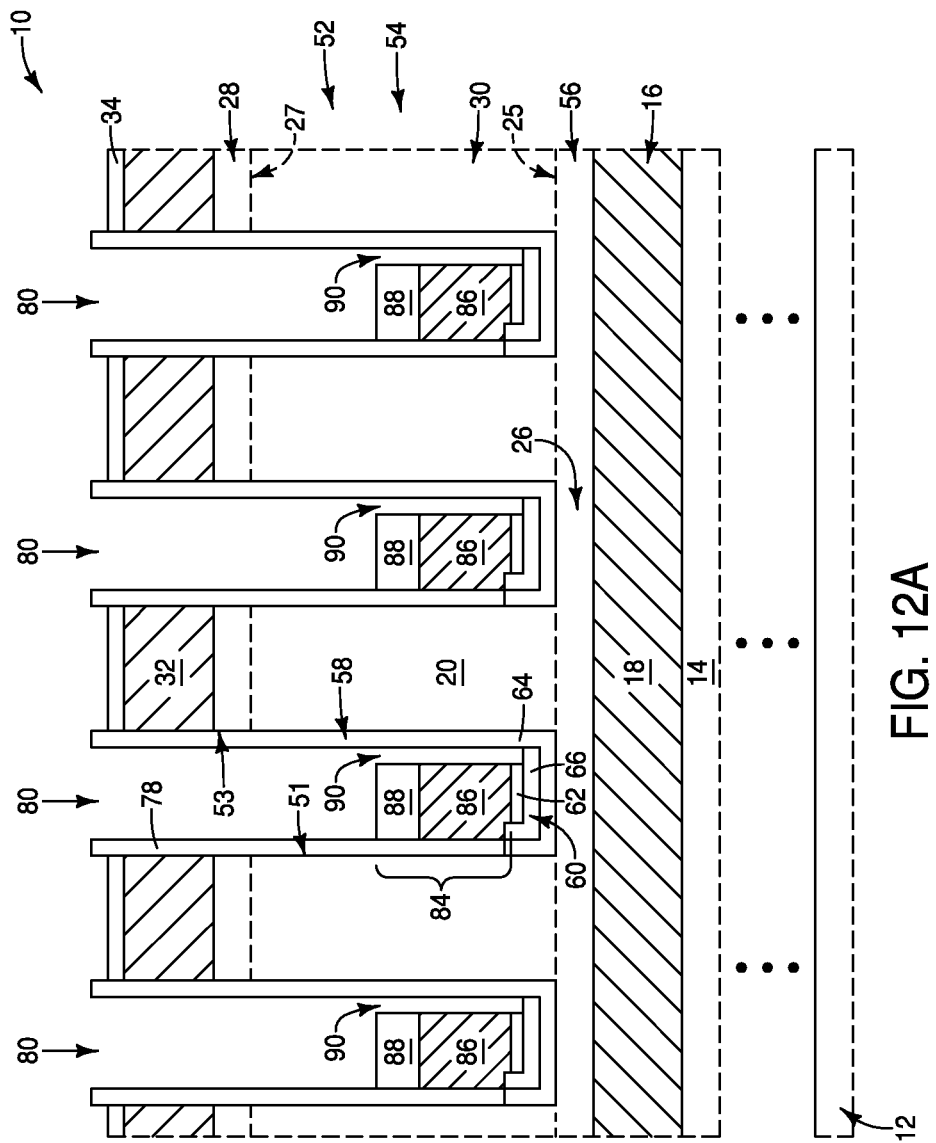
Figure 12B:
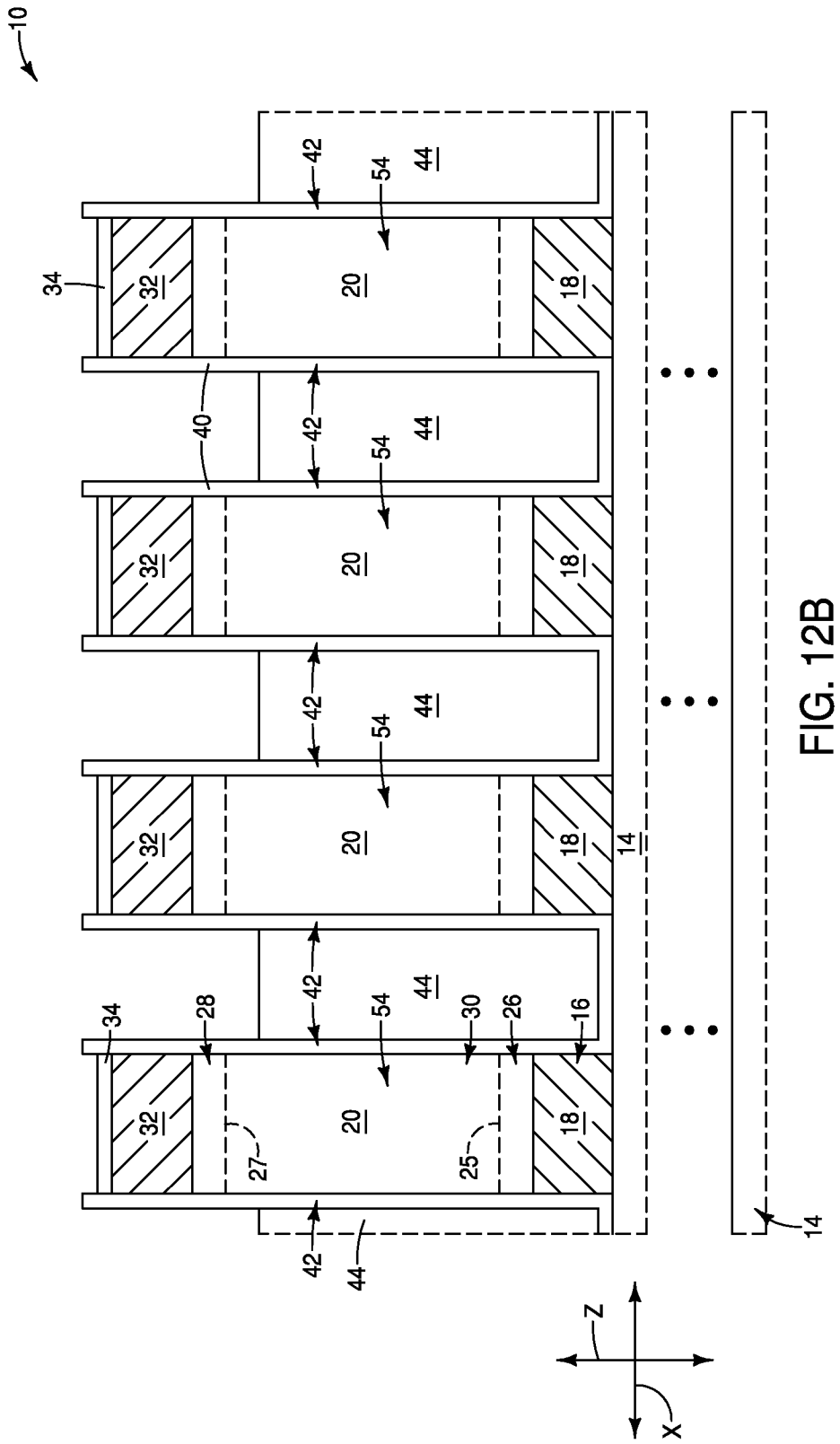

Referring to FIGS. 12-12B, a hot phosphoric etch is utilized to remove the silicon-nitride-containing materials 46 and 36 (FIGS. 11-11B), and to recess the silicon-nitride-containing material 66 of the second-material-liners 60 along the second sides 53 of the trenches 80. Voids 90 are thus formed along edges of the wordlines 84 adjacent the second sides 53 of the trenches 80.

Figure 13:
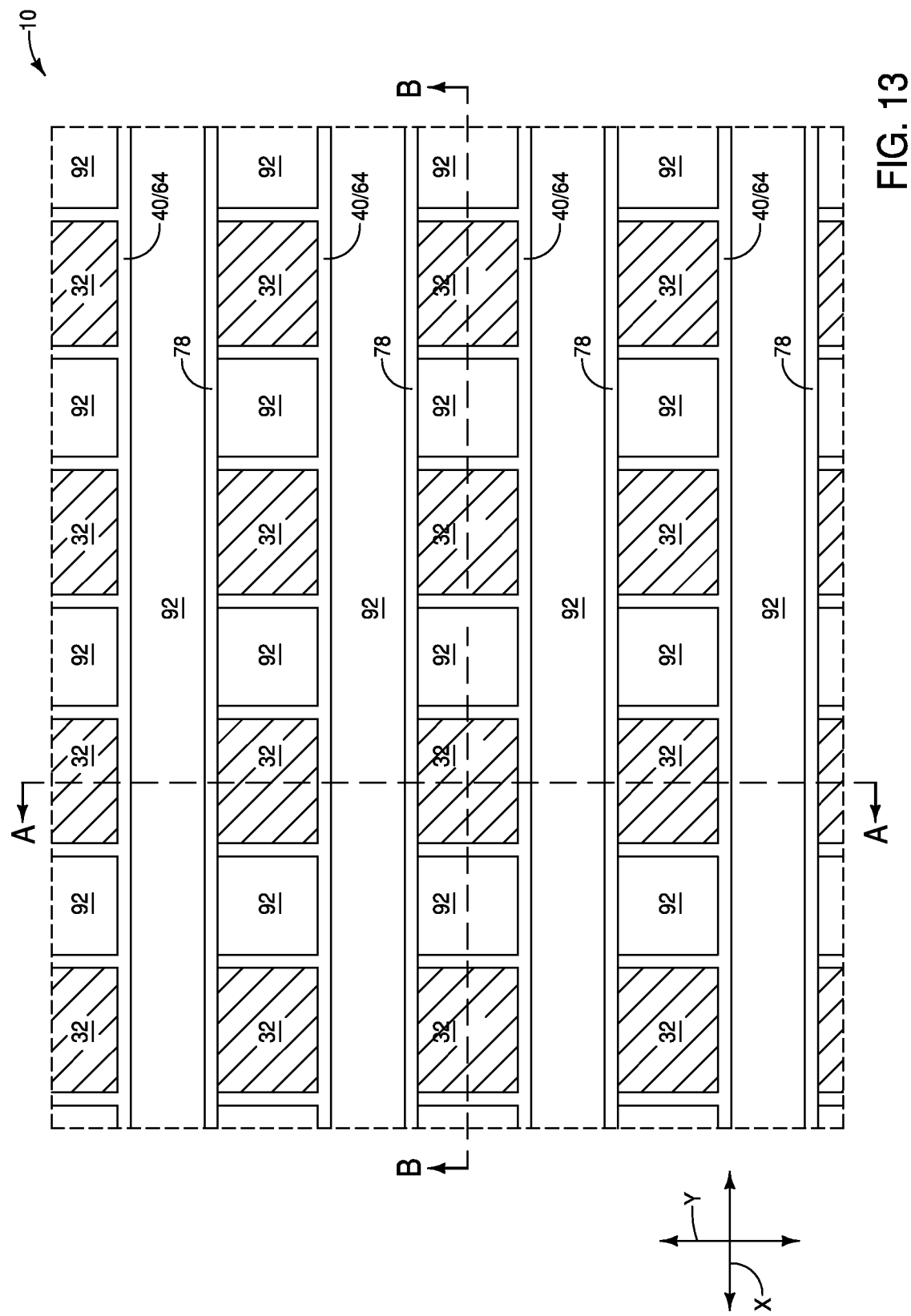

Referring to FIGS. 13-13B, insulative material 92 is formed within the trenches 80 to cap the voids 90. The insulative material 92 may comprise any suitable composition(s); and in some embodiments may comprise, consist essentially of, or consist of silicon dioxide. The insulative material 92 may or may not extend to uppermost surfaces of the wordlines 84. Gaps remain between the insulative material 92 and the tops of the wordlines 84 in the illustrated embodiment to assist the reader in visualizing the regions comprising the voids 90.

A planarized surface 93 is formed to extend across the materials 32, 40, 64, 78 and 92. The planarized surface 93 may be formed with any suitable processing, including, for example, CMP. The formation of the planarized surface removes the material 34 (FIGS. 12-12B).

Figure 14:
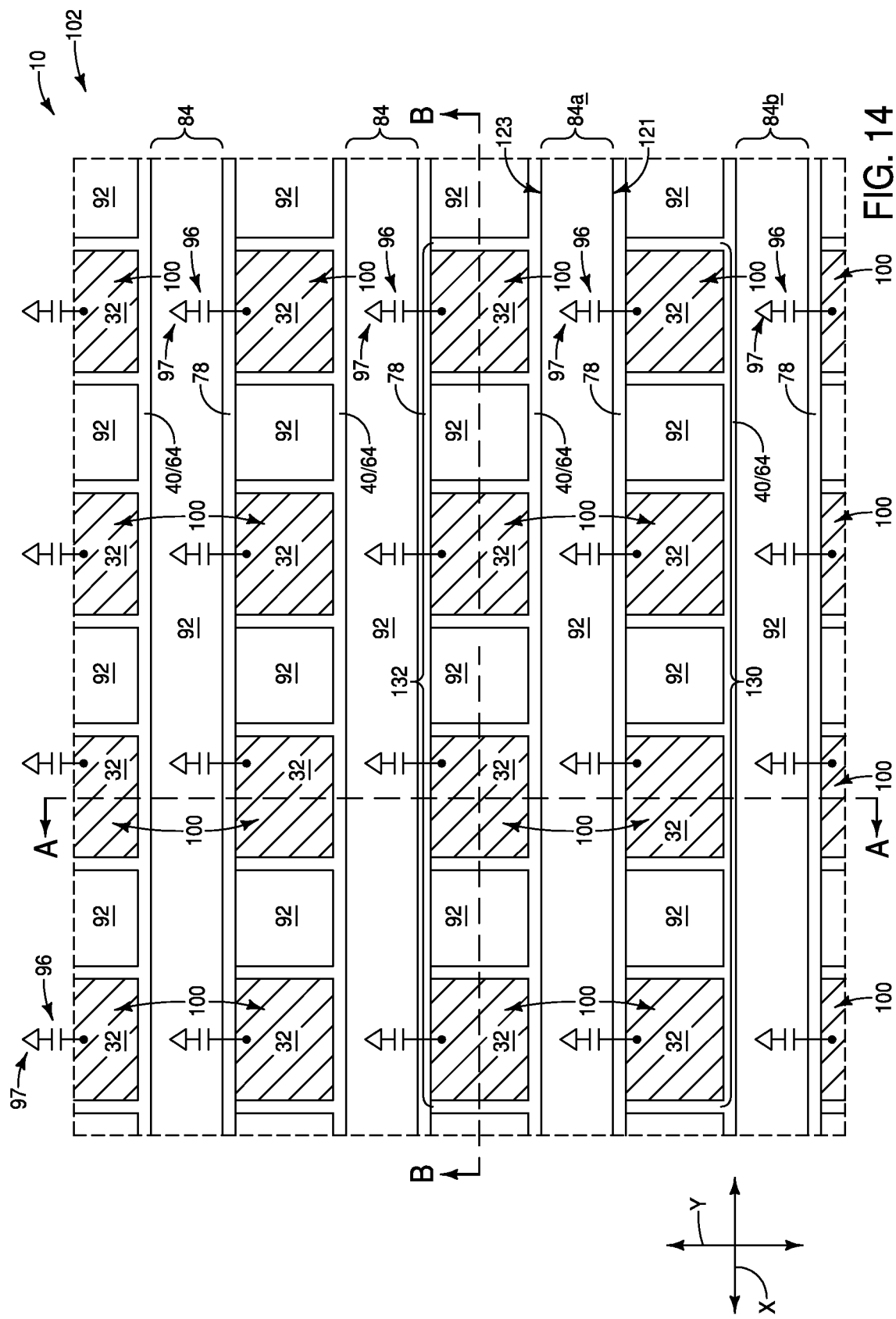
FIGS. 14-14B are diagrammatic views of the region of FIGS. 1-1B at an example process stage following that of FIGS. 13-13B.
Figure 14A:
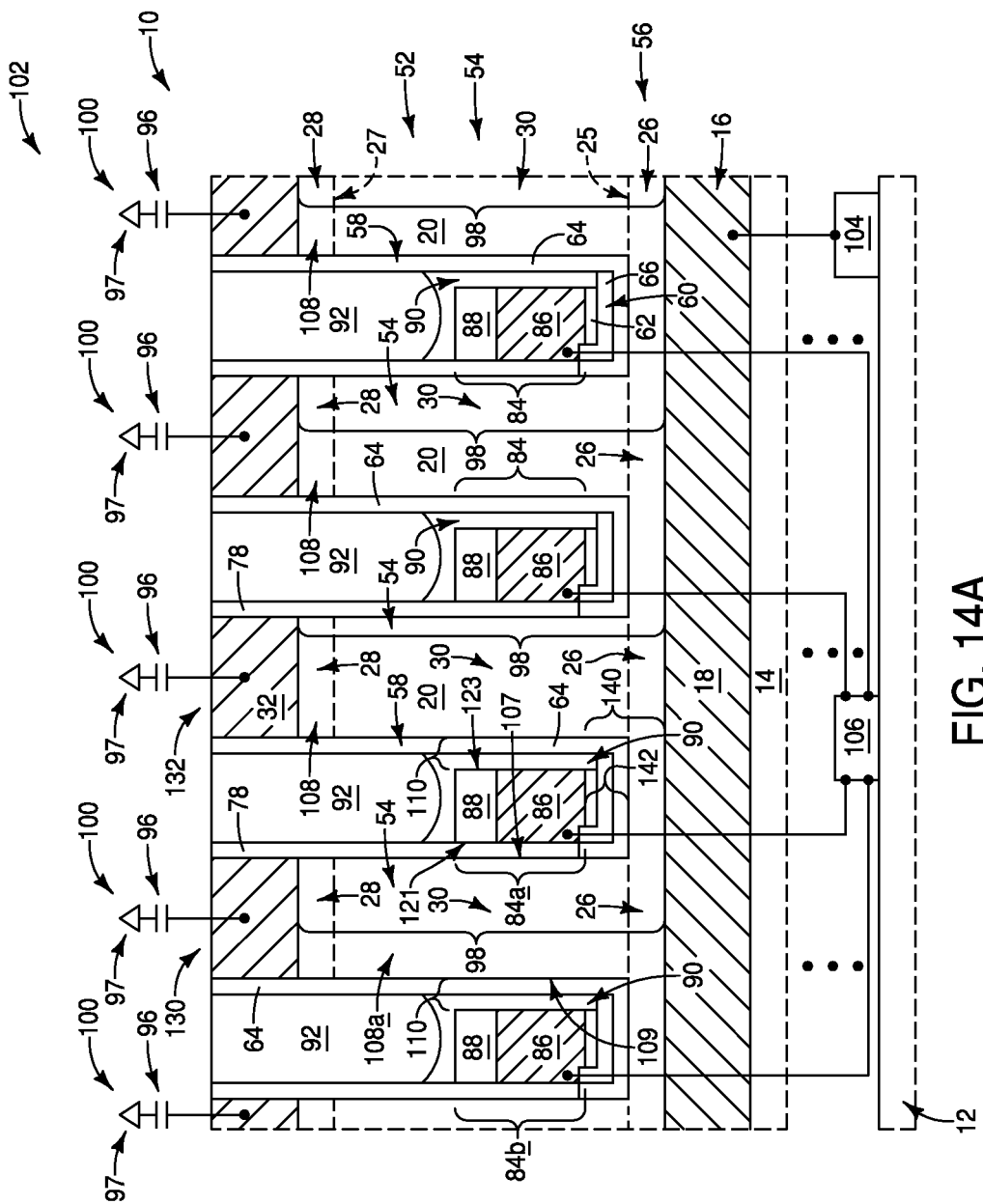
Figure 14B:
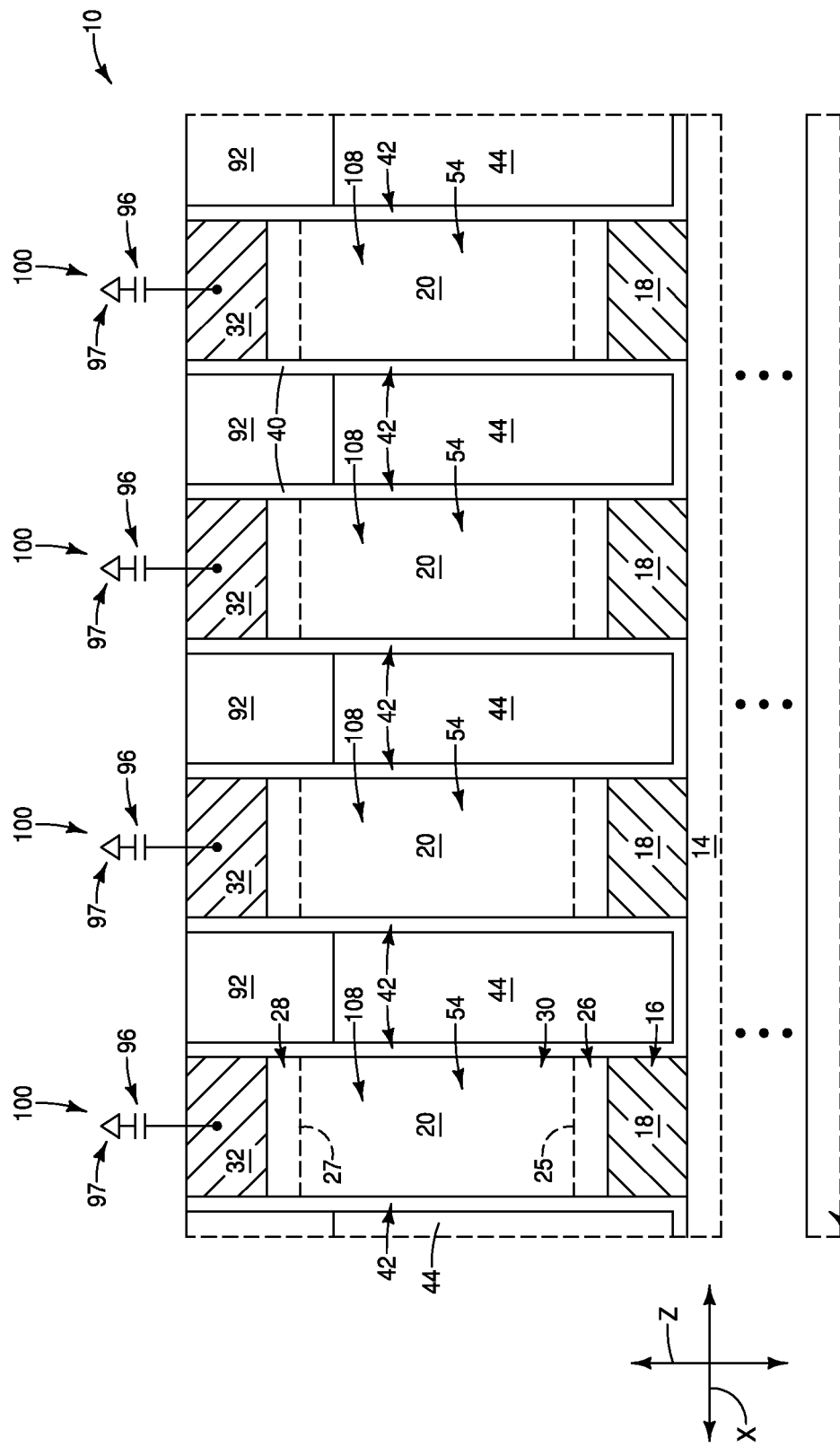

Referring to FIGS. 14-14B, storage elements 96 are formed to be electrically coupled with the top-electrode-material 32, and to be coupled with the top source/drain regions 28 through the top-electrode-material 32. The storage elements 96 may be any suitable devices having at least two detectable states; and in some embodiments may be, for example, capacitors, resistive-memory devices, conductive-bridging devices, phase-change-memory (PCM) devices, programmable metallization cells (PMCs), etc. In the shown embodiment, the storage elements 96 are capacitors. Each of the capacitors has one node coupled with the top-electrode-material 32, and has another node coupled with a suitable reference voltage 97 (illustrated with a triangle). The reference voltage 97 may be, for example, ground, VCC/2, etc.

The semiconductor-material-pillars 54 each comprise the upper and lower source/drain regions 26, and the channel region 30 between such upper and lower source/drain regions. The wordlines (gate lines) 84 may be considered to be operatively proximate the channel regions 30 such that operation of the wordlines 84 may control current flow along the channel regions 30 to control whether or not the source/drain regions 26 and 28 are coupled to one another. Specifically, suitable voltage along one of the wordlines 84 may induce an electric field within an associated channel region 30 to enable current flow within the channel region, and to thereby couple source/drain regions 26 and 28 to one another through the channel region. If the voltage is below a threshold suitable to induce the appropriate electric field within the associated channel region, the current flow will not be induced, and the source/drain regions will not be coupled with one another. In some embodiments, the selective operation of the channel region through current flow along an associated wordline may be referred to as gated operation of the channel region, and the wordline may be considered to be operated in a manner which gatedly couples associated source/drain regions with one another. Regions of the wordlines operatively proximate the channel regions 30 may be considered to be gates, and correspond to the regions along the cross-section of FIG. 14A.

Each of the semiconductor-material-pillars 54 may be considered to comprise a portion of an access transistor 98, with each of such access transistors comprising an upper source/drain region 28, a lower source/drain region 26, a channel region 30 between the upper and lower source/drain regions, and a segment of a wordline 84 associated with the channel region 30.

The storage elements 96 are coupled with the upper source/drain regions of the access transistors 98. Each storage element 96, together with the access transistor coupled with such storage element, may be considered to correspond to a memory cell 100 of a memory array 102. The memory array may be a DRAM array.

Figure 15:
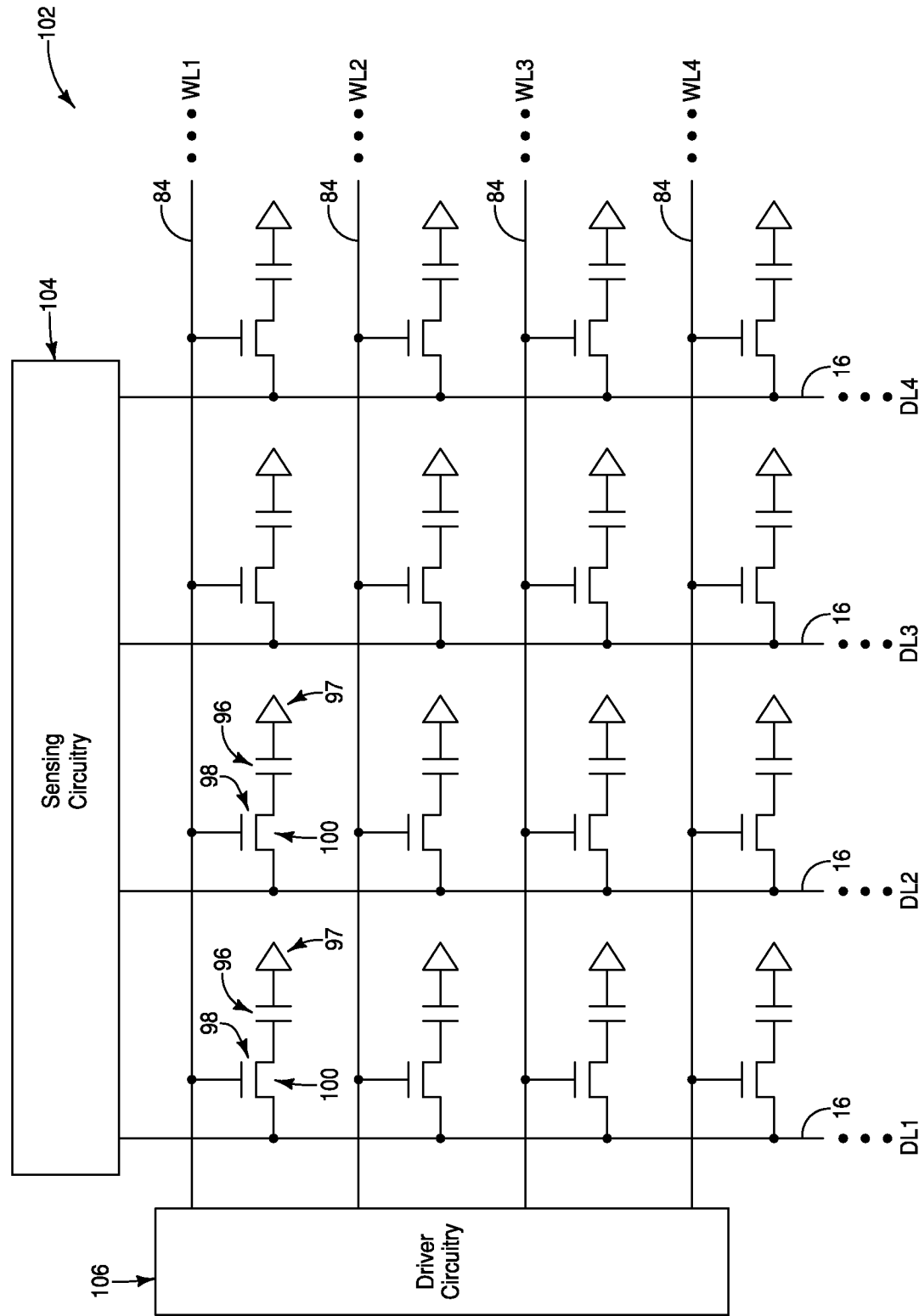
FIG. 15 is a schematic diagram of an example memory array.

The memory array 102 may have a configuration of the type schematically illustrated in FIG. 15. The memory array includes a series of wordlines 84 which are indicated to be wordlines WL1-WL4, and includes a series of digit lines 16 which indicated to be digit lines DL1-DL4. The digit lines are coupled with sensing circuitry (e.g., sense-amplifier-circuitry) 104, and the wordlines are coupled with driver circuitry (e.g., wordline-driver-circuitry) 106. Each of the memory cells 100 is uniquely addressed by one of the wordlines in combination with one of the digit lines.

Referring again to FIGS. 14-14B, the pillars 54 may be considered to be comprised by semiconductor-material-structures 108 which each comprise a first source/drain region 26, a second source/drain region 28, and a channel region 30 between the first and second source/drain regions.

Each of the semiconductor-material-structures 108 comprises a first side 107 and a second side 109 along the cross-section of FIG. 14A, with the second side being in opposing relation to the first side.

A wordline (e.g., conductive structure) 84 associated with the channel region 30 of the semiconductor-material-structure 108 is adjacent the first side 107 of the semiconductor-material-structure and is operatively proximate the channel region 30 to gatedly control coupling of the first and second source/drain regions 26 and 28 through the channel region. For instance, one of the semiconductor-material-structures 108 is labeled as 108a in FIG. 14A, and is associated with a wordline 84 which is labeled as 84a such that the wordline 84a is operatively proximate the channel region 30 (i.e., the wordline 84 is spaced from the channel region 30 by only the insulative material 78 corresponding to the gate-dielectric-material). The wordline 84a may be considered to be a first conductive structure which is along the first side 107 of the semiconductor-material-structure 108a.

A second conductive structure 84b is along the second side 109 of the semiconductor-material-structure 108a, and is spaced from the second side 109 of the semiconductor-material-structure 84b by an intervening region 110 which includes the void 90. Accordingly, the second conductive structure 84b is not operatively proximate the semiconductor-material-structure 108a, but is instead electrically isolated from such semiconductor-material-structure by the void-containing intervening region 110. In the illustrated embodiment, the intervening region 110 also includes the material 64. Such material is directly against the second side 109 of the semiconductor-material-structure 108a, and accordingly is between the semiconductor-material-structure 108a and the void 90. As discussed above, in some embodiments the material 64 may comprise carbon-doped silicon dioxide.

In some embodiments, the semiconductor-material-pillars 54 may be considered to be part of a semiconductor structure 52 which extends upwardly from the digit lines 16. Each of the wordlines 84 may be considered to comprise a first side 121 and an opposing second side 123, as shown relative to the wordline 84a along the cross-section of FIG. 14A and along the top view of FIG. 14. The semiconductor structures along the first side 121 of the wordline 84a may be considered to be a first set 130 of the semiconductor structures, and the semiconductor structures along the second side 123 of the wordline 84a may be considered to be a second set 132 of the structures. The channel regions 30 of the first set 130 of the semiconductor structures 52 are operatively proximate the first side 121 of the wordline 84a, as shown in FIG. 14A. In contrast, the channel regions 30 within the second set of the semiconductor structures 132 are spaced from the adjacent second side 123 of the wordline 84a by intervening regions 110 comprising voids 90, as shown in FIG. 14A.

In the illustrated embodiment of FIG. 14A, the wordlines 84 cross over the digit lines 16, and are spaced from the digit lines by intervening regions 140. Such intervening regions include insulative regions 142. The insulative regions include material 66 (which may comprise silicon nitride) and material 64 (which may comprise carbon-doped silicon dioxide); and in the shown embodiment also include the material 62 (which may comprise silicon dioxide) over the material 66.

The digit lines 16 may be coupled with sensing circuitry 104 of the type described previously relative to FIG. 15, and the wordlines 84 may be coupled with driver circuitry 106 of the type described previously relative to FIG. 15. FIG. 14A shows the regions 104 and 106 supported by the base 12, and under the memory array 102 (specifically, under the memory cells 100, the wordlines 84 and the digit lines 16).

In some embodiments, the circuitries 104 and 106 may comprise logic (e.g., CMOS). Although the circuitries 104 and 106 are shown to be under the memory array 102, in other embodiments at least a portion of one or both of the circuitries 104 and 106 may be in a location other than directly under the memory array 102.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly with a semiconductor-material-structure having a first source/drain region, a second source/drain region, and a channel region between the first and second source/drain regions. The semiconductor-material-structure has a first side and an opposing second side. A first conductive structure is adjacent to the first side and is operatively proximate the channel region to gatedly control coupling of the first and second source/drain regions through the channel region. A second conductive structure is adjacent to the second side and is spaced from the second side by an intervening region which includes a void.

Some embodiments include integrated memory having digit lines which extend along a first direction, and having semiconductor structures which extend upwardly from the digit lines. The semiconductor structures include pillars. Each of the pillars has an upper source/drain region and a channel region beneath the upper source/drain region. The semiconductor structures include lower source/drain regions beneath the channel regions. The lower source/drain regions are coupled with the digit lines. Storage elements are coupled with the upper source/drain regions. Gate lines extend along a second direction which crosses the first direction. Each of the gate lines has a first side and an opposing second side. A first set of the semiconductor structures is along the first side of an associated one of the gate lines, and a second set of the semiconductor structures is along the second side of said associated one of the gate lines. The channel regions within the first set of the semiconductor structures are operatively proximate the adjacent first side of said associated one of the gate lines so that said associated one of the gate lines provides gated control of the channel regions within the first set of the semiconductor structures. The channel regions within the second set of the semiconductor structures are spaced from the adjacent second side of said associated one of the gate lines by intervening regions which include voids.

Some embodiments include a method of forming an integrated assembly. Linear features are formed over a base. The linear features include digit lines and semiconductor-material-lines over the digit lines. The linear features extend along a first direction. Trenches are formed to extend into the linear features. The trenches extend along a second direction which crosses the first direction. The trenches extend into the semiconductor-material-lines but do not break the digit lines. The trenches pattern semiconductor-material-structures from the semiconductor-material-lines. The semiconductor-material-structures include semiconductor-material-pillars. The semiconductor-material-structures include upper source/drain regions at upper regions of the semiconductor-material-pillars, channel regions within the semiconductor-material-pillars and under the upper source/drain regions, and lower source/drain regions under the channel regions and coupled with the digit lines. First-material-liners are formed within the trenches. Second-material-liners are formed over the first-material-liners. The second-material-liners are recessed along first sides of the trenches while not being recessed along opposing second sides of the trenches. Gate lines are formed within the trenches and over the recessed second-material-liners. After the gate lines are formed, the second-material-liners are recessed along the second sides of the trenches to form voids. The voids are capped.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   a semiconductor-material-structure having a first source/drain region, a second source/drain region, and a channel region between the first and second source/drain regions; the semiconductor-material-structure having a first side and an opposing second side;
   a first conductive structure adjacent the first side and spaced from the first side by a first liner and a second liner; and
   a second conductive structure adjacent the second side and spaced from the second side by an intervening region which includes a void.

2. The integrated assembly of claim 1 wherein the semiconductor material of the semiconductor-material-structure comprises silicon.

3. The integrated assembly of claim 1 wherein the first source/drain region is coupled with a digit line, and wherein the second source/drain region is coupled with a storage element.

4. The integrated assembly of claim 3 wherein the storage element is a capacitor.

5. The integrated assembly of claim 1 wherein the intervening region includes carbon-doped silicon dioxide between the semiconductor-material-structure and the void.

6. The integrated assembly of claim 1 wherein the first liner comprises an insulative material, and the second liner comprises carbon-doped silicon dioxide.

7. The integrated assembly of claim 1 wherein the first and second conductive structures each include a metal-containing-region directly against a doped-semiconductor-containing-region.

8. Integrated memory, comprising:
   digit lines extending along a first direction;
   semiconductor structures extending upwardly from the digit lines; the semiconductor structures including pillars; each of the pillars having an upper source/drain region and a channel region beneath the upper source/drain region; the semiconductor structures including lower source/drain regions beneath the channel regions; the lower source/drain regions being coupled with the digit lines;
   storage elements coupled with the upper source/drain regions;
   gate lines extending along a second direction which crosses the first direction; and
   each of the gate lines having a first side and an opposing second side; a first set of the semiconductor structures being along the first side of an associated one of the gate lines and spaced from the first side by a first liner material comprising carbon-doped silicon dioxide and a second liner material, and a second set of the semiconductor structures being along the second side of said associated one of the gate lines, the channel regions within the second set of the semiconductor structures being spaced from the adjacent second side of said associated one of the gate lines by intervening regions which include voids.

9. The integrated memory of claim 8 wherein upper regions of the voids are capped by insulative material.

10. The integrated memory of claim 9 wherein the insulative material comprises silicon dioxide.

11. The integrated memory of claim 8 wherein the intervening regions include carbon-doped silicon dioxide.

12. The integrated memory of claim 8 wherein the gate lines cross over the digit lines and are spaced from the digit lines by intervening regions which include insulative regions comprising silicon nitride and carbon-doped silicon dioxide.

13. An integrated assembly, comprising:
  linear features over a base; the linear features including digit lines and semiconductor-material-linear-configurations over the digit lines; the linear features extending along a first direction;
  trenches extending into the linear features; the trenches extending along a second direction which crosses the first direction; the trenches patterning semiconductor material pillars from the semiconductor-material-linear-configurations; the pillars comprising upper source/drain regions, channel regions and lower source/drain regions coupled with the digit lines;
  first liners comprising a first material within the trenches;
  second liners over the first liners;
  gate lines within the trenches and over second liners;
  voids within the trench adjacent the gate lines; and
  caps over the voids.

14. The integrated assembly of claim 13 wherein the first liners comprise carbon-doped silicon dioxide.

15. The integrated assembly of claim 13 wherein the second liners comprise silicon nitride.

16. The integrated assembly of claim 13 wherein portions of the lower source/drain regions are under the pillars.

17. The integrated assembly of claim 13 further comprising insulative material between the linear features.

18. The integrated assembly of claim 13 wherein the caps comprise silicon dioxide.

* * * * *